(12) United States Patent
Koo et al.

(10) Patent No.: US 10,396,434 B2
(45) Date of Patent: Aug. 27, 2019

(54) ELECTRONIC DEVICE WITH ANTENNA

(71) Applicant: Samsung Electronics Co., Ltd., Gyeonggi-do (KR)

(72) Inventors: Young Gwon Koo, Seoul (KR); Dong Ryul Shin, Daegu (KR); Jin Woo Jung, Seoul (KR); Byoung Uk Yoon, Gyeonggi-do (KR); Jae Bong Chun, Gyeonggi-do (KR); Hyun Suk Choi, Daegu (KR)

(73) Assignee: Samsung Electronics Co., Ltd (KR)

( * ) Notice: Subject to any disclaimer, the term of this patent is extended or adjusted under 35 U.S.C. 154(b) by 192 days.

(21) Appl. No.: 15/411,340

(22) Filed: Jan. 20, 2017

(65) Prior Publication Data

US 2017/0207516 A1    Jul. 20, 2017

(30) Foreign Application Priority Data

Jan. 20, 2016  (KR) .................. 10-2016-0007191

(51) Int. Cl.
*H01Q 1/12*         (2006.01)
*H01Q 1/22*         (2006.01)
(Continued)

(52) U.S. Cl.
CPC ........... *H01Q 1/243* (2013.01); *H01Q 1/1207* (2013.01); *H01Q 1/2291* (2013.01); *H01Q 1/38* (2013.01);
(Continued)

(58) Field of Classification Search
CPC ............ H01Q 1/243; H01Q 1/48; H01Q 1/38; H05K 1/028
See application file for complete search history.

(56) References Cited

U.S. PATENT DOCUMENTS 8,665,164 B2  3/2014  Hill et al.
8,723,824 B2  5/2014  Myers et al.
(Continued)

FOREIGN PATENT DOCUMENTS

JP      2010217138    9/2010
WO   WO 2012/117684   9/2012

OTHER PUBLICATIONS

European Search Report dated May 29, 2018 issued in counterpart application No. 17152018.2-1205, 8 pages.

(Continued)

*Primary Examiner* — Ricardo I Magallanes
(74) *Attorney, Agent, or Firm* — The Farrell Law Firm, P.C.

(57) ABSTRACT

An electronic device is provided. The electronic device includes a housing including a first surface, a second surface, and a side plate surrounding part of a space between the first surface and the second surface, a display disposed in the housing, a first plate attached to or integrated into the display, a second plate facing in the third direction and positioned adjacent to the side plate, a flexible printed circuit board (FPCB) including a first planar portion coupled to the first plate, and a second planar portion coupled to the second plate and angled from the first planar portion, a printed circuit board (PCB) interposed between the display and the second surface, and a mid-plate disposed in the housing, wherein the second planar portion of the FPCB is interposed between a side surface of the mid-plate and the second plate separated from each other by a gap.

17 Claims, 19 Drawing Sheets

(51) Int. Cl.
*H01Q 1/24* (2006.01)
*H01Q 1/38* (2006.01)
*H01Q 1/42* (2006.01)
*H01Q 1/44* (2006.01)
*H01Q 1/48* (2006.01)
*H01Q 1/52* (2006.01)
*H01Q 9/42* (2006.01)
*H04M 1/02* (2006.01)
*H05K 1/02* (2006.01)
*H05K 1/18* (2006.01)
*H01Q 13/10* (2006.01)
*H04B 1/3827* (2015.01)

(52) U.S. Cl.
CPC .......... *H01Q 1/42* (2013.01); *H01Q 1/44* (2013.01); *H01Q 1/48* (2013.01); *H01Q 1/526* (2013.01); *H01Q 9/42* (2013.01); *H01Q 13/10* (2013.01); *H04B 1/3833* (2013.01); *H04M 1/0249* (2013.01); *H04M 1/0266* (2013.01); *H04M 1/0277* (2013.01); *H05K 1/028* (2013.01); *H05K 1/181* (2013.01); *H05K 1/189* (2013.01)

(56) References Cited

U.S. PATENT DOCUMENTS

| | | | |
|---|---|---|---|
| 8,836,587 B2 | 9/2014 | Darnell et al. | |
| 8,976,141 B2 | 3/2015 | Myers et al. | |
| 9,070,969 B2 | 6/2015 | Mow et al. | |
| 9,172,148 B2 | 10/2015 | Lyons et al. | |
| 9,257,740 B2 | 2/2016 | Lyons et al. | |
| 9,411,451 B2 | 8/2016 | Myers et al. | |
| 9,502,752 B2 | 11/2016 | Darnell et al. | |
| 9,705,180 B2 | 7/2017 | Darnell et al. | |
| 9,791,949 B2 | 10/2017 | Myers et al. | |
| 2009/0224986 A1* | 9/2009 | Hotta | H01Q 1/243 343/702 |
| 2010/0123632 A1 | 5/2010 | Hill et al. | |
| 2012/0001807 A1* | 1/2012 | Lee | H01Q 1/243 343/702 |
| 2012/0009983 A1 | 1/2012 | Mow et al. | |
| 2013/0076649 A1 | 3/2013 | Myers et al. | |
| 2013/0081756 A1* | 4/2013 | Franklin | B29C 53/04 156/221 |
| 2013/0257659 A1* | 10/2013 | Darnell | H01Q 1/243 343/702 |
| 2013/0279088 A1* | 10/2013 | Raff | G06F 1/1637 361/679.01 |
| 2014/0211122 A1* | 7/2014 | Wurzel | G02F 1/133308 349/61 |
| 2014/0225786 A1 | 8/2014 | Lyons et al. | |
| 2014/0240289 A1 | 8/2014 | Myers et al. | |
| 2015/0035706 A1 | 2/2015 | Darnell et al. | |
| 2015/0130767 A1 | 5/2015 | Myers et al. | |
| 2015/0227227 A1 | 8/2015 | Myers et al. | |
| 2015/0280771 A1 | 10/2015 | Mow et al. | |
| 2015/0364813 A1 | 12/2015 | Darnell et al. | |
| 2016/0013544 A1 | 1/2016 | Lyons et al. | |
| 2018/0052540 A1 | 2/2018 | Myers et al. | |

OTHER PUBLICATIONS

European Search Report dated Jun. 8, 2017 issued in counterpart application No. 17152018.2-1927, 11 pages.

* cited by examiner

ELECTRONIC DEVICE WITH ANTENNA

PRIORITY

This application claims priority under 35 U.S.C. § 119(a) to Korean Patent Application Serial No. 10-2016-0007191, which was filed on Jan. 20, 2016 in the Korean Intellectual Property Office, the entire disclosure of which is incorporated herein by reference.

BACKGROUND

1. Field of the Invention

The present disclosure generally relates to an electronic device, and more particularly, to an antenna technology that includes components mounted on an electronic device.

2. Description of the Related Art

An electronic device that supports wireless communication is equipped with an antenna. A mobile electronic device, such as a smartphone or a tablet, may transmit and receive signals of specific frequency bands, while a metallic body that is arranged within the electronic device or defines an external appearance of the electronic device, is used as a signal radiator. In operation of the antenna, a metallic body may provide a ground area for the antenna, in addition to the metallic body operating as a signal radiator. In general, a ground layer in a substrate of the electronic device performs a function corresponding to a ground area of the antenna.

The electronic device may include a display panel for a display. When the display function is implemented, noise may occur in a display driving circuit such as a display driving integrated chip (DDIC). In order to prevent noise from interfering with the operation of internal parts of the electronic device, a thin metal plate acting as a shield may be arranged on a rear surface of the display panel.

The extent of the substrate mounted on the electronic device is limited by a battery or other parts, which may cause an insufficient ground area.

In an antenna mounted in a smartphone, a radiator may be arranged between a bracket and a rear case, or a side metal frame may be utilized as a radiator. The radiator is arranged at the location for several reasons, but because the location and form of the radiator are less deformed as compared with the case in which the radiator is arranged between the display and the substrate, a stable performance results. When a metal area (the radiator) that is adjacent to the display panel is arranged at a right angle or other angles with respect to the display surface, the antenna radiator may be damaged or distorted during assembling the smartphone.

An aspect of the present disclosure provides an antenna device that secures a wider ground area by using a metal area that is adjacent to a display panel and uses a display structure as well.

SUMMARY

In accordance with an aspect of the present disclosure, an electronic device is provided. The electronic device includes an antenna structure for preventing damage to an antenna radiator during assembly of the antenna radiator when an antenna using a display structure is mounted and maintains a bonded state after the assembly process.

In accordance with another aspect of the present disclosure, an electronic device is provided which includes a housing that includes a first surface that faces a first direction, a second surface that faces a second direction that is opposite to the first direction, and a side plate that faces a third direction that is substantially perpendicular to the first direction and surrounds a space between the first surface and the second surface, a display disposed in the housing and is exposed through the first surface, a first plate that is attached to the display or is integrated into the display, the first plate facing the first direction and including a first periphery that extends along the side plate, a second plate that faces the third direction and is arranged adjacent to the side plate, the second plate including a second periphery that extends along the first periphery, a flexible printed circuit board (FPCB) that includes a first planar portion that is coupled to the first plate, and a second planar portion that is coupled to the second plate and is angled from the first planar portion, a printed circuit board (PCB) interposed between the display and the second surface, and a mid-plate that is arranged within the housing while supporting the PCB, wherein the second planar portion of the FPCB is inserted between a side surface of the mid-plate and the second plate, and the side surface and the second planar portion of the FPCB are separated from each other by a gap.

In accordance with another aspect of the present disclosure, an electronic device is provided which includes a cover window that defines at least a portion of a side housing of the electronic device and a front housing of the electronic device, a display panel that is arranged under the cover window, a metal panel that is arranged under the display panel and includes a first area that is arranged parallel to the front housing and a second area that defines a specific angle with the first area, a conductor that is attached to a lower side of the first area and an inner side of the second area, an insulation member that is arranged between the conductor and a printed circuit board (PCB) and has an opening, and a control circuit that is arranged on the PCB and is electrically connected to the conductor through a connection member provided through the opening.

In accordance with another aspect of the present disclosure, an electronic device is provided which includes a cover window that defines a front housing of the electronic device, a display panel that is arranged under the cover window, a metal panel that is arranged under the display panel and parallel to the front housing, a metal frame that defines a side housing of the electronic device, a conductor which is arranged under the metal panel and one end of which is angled to electrically contact the metal frame, an insulation member that is arranged between the conductor and a printed circuit board (PCB) and has an opening, and a control circuit that is arranged on the PCB and is electrically connected to the conductor through a connection member provided through the opening.

BRIEF DESCRIPTION OF THE DRAWINGS

The above and other aspects, features, and advantages of certain embodiments of the present disclosure will be more apparent from the following description when taken in conjunction with the accompanying drawings, in which.

DETAILED DESCRIPTION

Figure 1A:
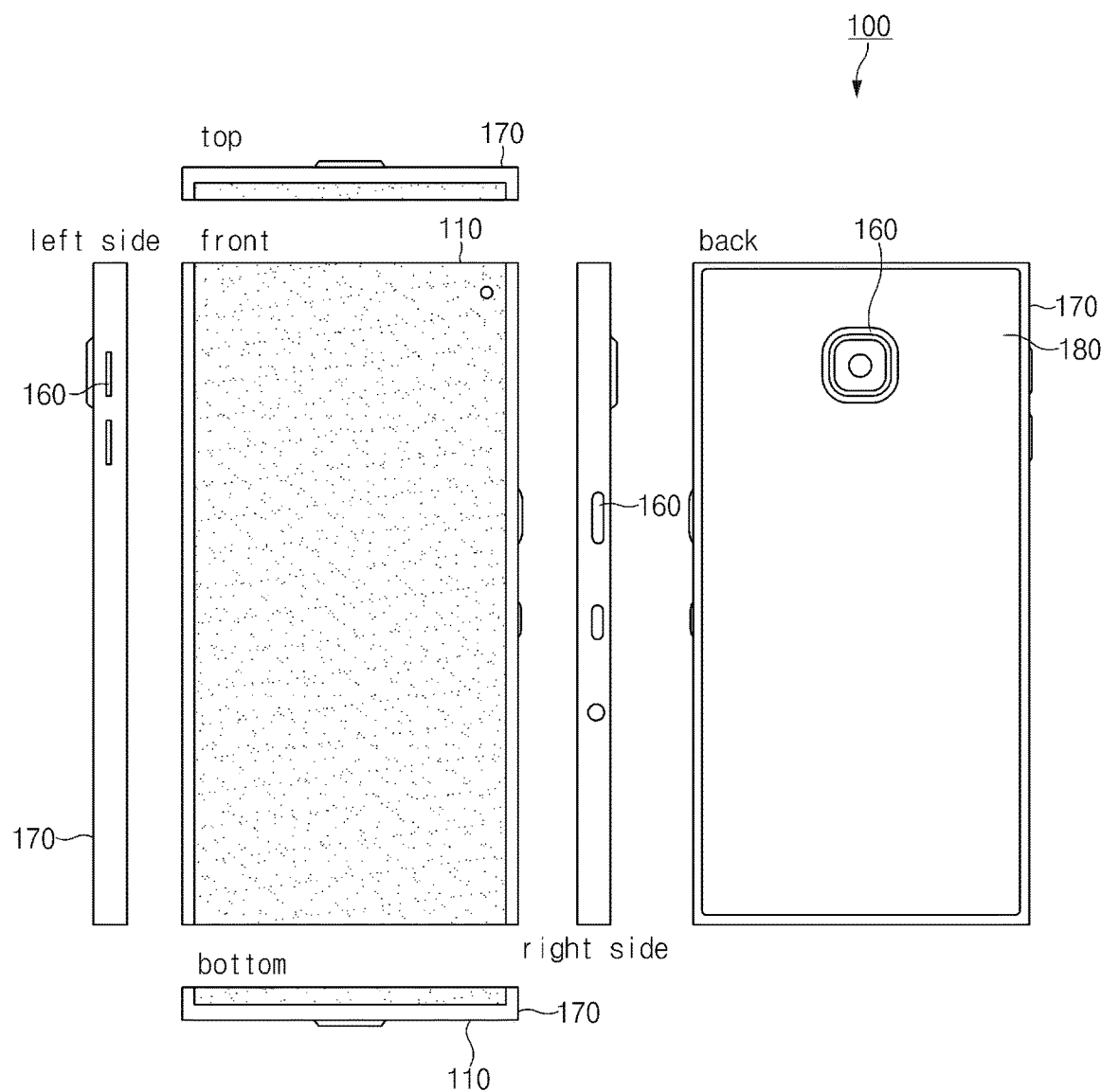
FIG. 1A illustrates a front surface, side surfaces, and a rear surface of an electronic device, according to an embodiment of the present disclosure.

Hereinafter, certain embodiments of the present disclosure will be described with reference to the accompanying drawings. Accordingly, those of ordinary skill in the art will recognize that modifications, equivalents, and/or alternatives on the embodiments described herein can be variously made without departing from the scope and spirit of the present disclosure. With regard to the descriptions of the drawings, similar components may be marked by similar reference numerals.

FIG. 1A illustrates a front surface, side surfaces, and a rear surface of an electronic device, according to an embodiment of the present disclosure.

According to an embodiment of the present disclosure, an electronic device 100 includes a front cover window 110, a rear case 170 (e.g., a metal frame or a plastic case), and a rear cover 180. The electronic device 100, for example, may correspond to a user mobile device such as a smartphone, a tablet, or a smart notebook.

According to an embodiment of the present disclosure, the front cover window 110 may be angled from one surface of the electronic device 100. For example, the cover window 110 may be angled from an upper surface or a lower surface of the electronic device 100. In this case, the cover window 110 and the rear case 170 may define the upper surface or the lower surface of the electronic device 100. The top view of FIG. 1A illustrates that the cover window 110 is angled at an upper end of the electronic device 100, and the bottom view of FIG. 1A illustrates that the cover window 110 is angled at a lower end of the electronic device 100. In addition to the example of FIG. 1A, the cover window 100 may be angled from a left side surface, a right side surface, or at least one of a plurality of surfaces that defines an external shape of the electronic device 100. The cover window 100 may be arranged on a front surface of the electronic device 100.

According to an embodiment of the present disclosure, components 160 for performing various operations and functions of the electronic device 100 may be included in the interior of the electronic device 100. Some of the components 160 may be exposed to the outside of the electronic device 100. For example, a volume button for controlling the volume of audio which is output from the electronic device 100, may protrude from a left side of the electronic device 100. A button for switching on and off a display, or a power source of the electronic display 100, may be arranged on a right side of the electronic device 100. A camera lens for a photographing function may be arranged on the back of the electronic device 100. The above-mentioned components 160 are certain examples, and may be properly modified by those skilled in the art.

Figure 1B:
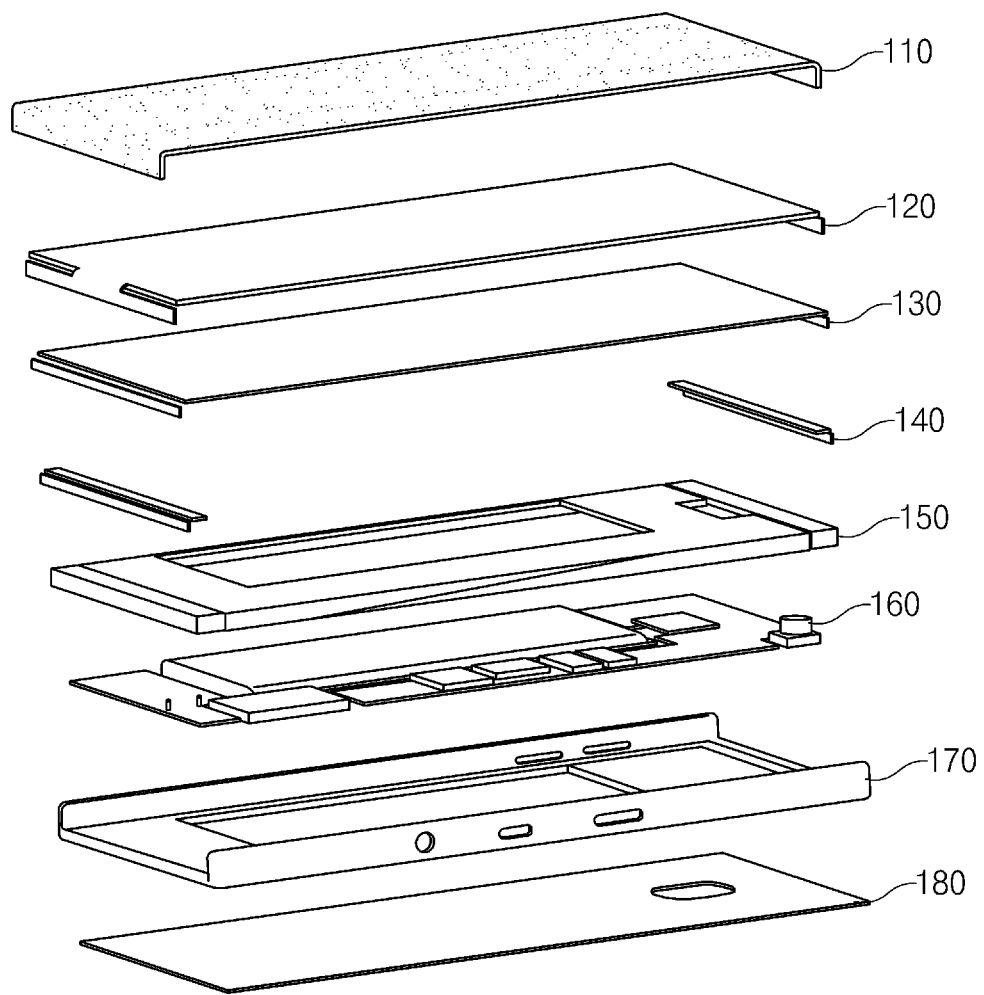
FIG. 1B is an exploded perspective view of an electronic device, according to an embodiment of the present disclosure.

FIG. 1B is an exploded perspective view of the electronic device of FIG. 1A, according to an embodiment of the present disclosure.

Referring to FIG. 1B, a display panel 120 may be arranged under the front cover window 110 of the electronic device 100. The display panel 120 may have a shape corresponding to the cover window 110. For example, when the cover window 110 covers at least a portion (e.g. an upper surface and a lower surface) of a side housing of the electronic device 100 and a front housing, the display panel 120 also may include a front display area and an area for upper and lower displays as illustrated in FIG. 1B.

When the display panel 120 of FIG. 1B is implemented by a liquid crystal display (LCD), the display panel 120 having three separated parts may include a plurality of separated display panels (e.g., a front surface, a lower surface, and an upper surface), or may be implemented by connecting intermediate portions of the separated parts of the display panel. When the display panel 120 is implemented by a flexible display, a plurality of separated panels may be disposed on the surfaces of the electronic device 100. Further, the display panel 120 may be angled at corners of upper and lower ends of the front surface of the electronic device 100, and some areas corresponding to the corners may be disconnected or may be filled with a non-display area. The display panel 120 may have a form that is the same as, or similar to, that of the cover window 110 without slotted grooves of the corners of FIG. 1B.

According to an embodiment of the present disclosure, the display panel 120 may include a plurality of layers. For example, when the display panel 120 is an organic light emitting diode (OLED), it may include a thin film transistor (TFT)/OLED layer, an encapsulation glass layer, and a polarizer. When the display panel 120 is a liquid crystal display (LCD), it may include a back light unit (BLU), a polarizer, glass, a TFT/electrode layer, a liquid crystal, a color filter, and a polarizer. When the display panel 120 supports a touch function, a touch panel may be additionally provided. The display panel 120 may be referred to as a display 120.

According to an embodiment of the present disclosure, a conductive layer such as a metal panel 130 for shielding noise generated when the display is driven may be arranged under the display panel 120. The metal panel 130 may be attached to the display panel 120 or may be integrated into the display panel 120. Further, the metal panel 130 may have a shape that is the same as, or similar to, that of the display panel 120. For example, as illustrated in FIG. 1B, when the display panel 120 is angled at an upper end and a lower end of the electronic device 100 and a front area and an upper end area, and a lower end area of the display panel 120 are physically connected to each other, the metal panel 130 also may include a front area, an upper end area, and a lower end area, which are physically connected to each other. However, the areas corresponding to the metal panel 130 may not be physically connected to each other, and it may be understood that a plurality of physically spaced areas are included in the metal panel 130.

According to an embodiment of the present disclosure, the metal panel 130 may have a front area and at least one side area. For example, the metal panel 130 may include a first area (e.g., a first plate) that is arranged parallel to a front housing of the electronic device 100 or a front surface of the display panel 120, and a second area (e.g., a second plate) that is angled from one end of the first area or is separated from one end of the first area. The first area faces a first direction (e.g., a front surface of the electronic device 100), and the first area may include a first periphery that extends along a side housing or a side plate. Further, the second area faces a third direction (e.g., a side surface of the electronic device 100) that is perpendicular to the first area or is substantially perpendicular to the third area (e.g., a side surface), and may be arranged adjacent to the side housing (the side plate). Further, the second area may include a second periphery that extends along the first periphery.

The first area and the second area may define a specific angle. For example, the second area may define an angle of 90 degrees with the first area, and in this case, the second area may be arranged parallel to a side surface of the electronic device 100. However, when the electronic device 100 includes a side display having a specific inclination (e.g., 30 degrees), the second area may be arranged in parallel to the side display, that is, it may be arranged to have the specific angle (i.e., 30 degrees) with the first area. Hereinafter, it will be described that the first area and the second area of the metal panel 130 is perpendicular to each other unless specifically defined otherwise.

According to an embodiment of the present disclosure, a conductor 140 (e.g., a flexible printed circuit board (FPCB)) may be arranged to contact the metal panel 130. The conductive material 140 may physically contact both the first area and the second area of the metallic panel 130. When the second area of the metal panel 130 is operated as a first antenna radiator, at least a portion of the conductor 140 may be operated as a second antenna radiator. For example, an antenna radiator that has an electrical path defined by the conductor 140 and the second area of the metal panel 130 may be implemented. In this case, the first area of the metal panel 130 may correspond to a ground (GND) area.

In an embodiment of the present disclosure, the conductor 140 may be coupled to the metal panel 130 to operate as an antenna feeder. For example, the conductor 140 may be implemented by an FPCB, and may be connected to the PCB 161 or a control circuit (e.g., a wireless communication circuit) such that electric power may be provided to one point of the second area 132 of the metal panel 130 as described with reference to FIG. 2B below.

According to an embodiment of the present disclosure, the electronic device 100 may include an insulation member bracket 150. The bracket 150 provides a space, in which the components 160 of the electronic device 100 may be mounted, and may function to support the components 160 such that the components 160 may be fixed to proper locations. For example, the bracket 150 functions as a mid-plate, and may support the printed circuit board (PCB) 161. The shape of the bracket 150 may be modified based on the structure of the electronic device 100. The bracket 150 may have an opening or a hole in which various parts are mounted or through which a connection member is inserted. Here, the connection member may include a C-clip or a pogo pin for electrically connecting a substrate (e.g., a PCB) and an antenna radiator.

According to an embodiment of the present disclosure, the components 160 may include various electrical parts, other parts, wires, and a substrate, which are mounted within the electronic device 100, and portions of which may be exposed to the outside.

According to an embodiment of the present disclosure, the rear case 170 may prevent certain components 160 from being exposed when the rear cover 180 is removed. For example, when the rear cover 180 is removed from the electronic device 100, the components 160 other than a battery and a subscriber identification module (SIM) card may not be exposed. However, the rear case 170 and the rear cover 180 may be integrated. For example, in a smartphone, in which a battery cannot be detachably mounted by the user, the rear case 170 and the rear cover 180 may be integrated.

The external appearance of the electronic device 100 of FIG. 1B may be constructed by the front cover window 110, the rear case 170, the rear cover 180, the front cover window 110 and the rear case 170. However, the external appearance of the electronic device 100 of FIG. 1B is shown as an example, and the external appearance of the electronic device 100 may be variously modified, for example, by front glass, a rear cover, or a side metal frame.

Figure 1C:
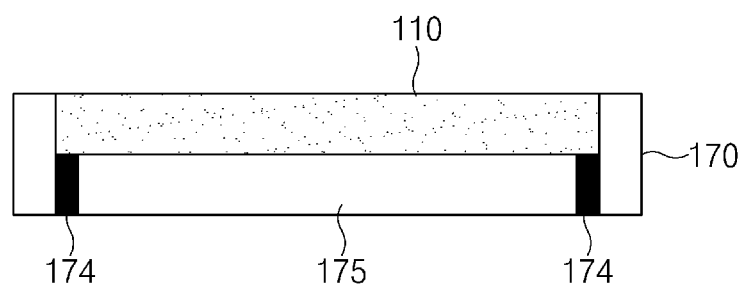
FIG. 1C illustrates an upper end or a lower end of an electronic device, according to an embodiment of the present disclosure.

FIG. 1C illustrates an upper end or a lower end of an electronic device, according to an embodiment of the present disclosure.

Referring to FIG. 1C, the cover window 110 may be expanded from the front surface of the electronic device 100 to extend to an upper end area and/or a lower end area of the electronic device 100. When the rear case 170 of the electronic device 100 includes metal, the rear case 170 may include an insulator 174 that partitions an area of an antenna radiator from the other areas such that an area 175 of the rear case may be used as the antenna radiator at an upper end area or a lower end area of the electronic device 100. An area of the antenna radiator that is insulated from the other areas by the insulator 174 may be used to transmit and receive a signal of a targeted frequency band. As the targeted frequency band changes, the insulator 174 may be arranged at a location that is different from that of FIG. 1C.

Although it is illustrated in FIG. 1C that a metal frame that constitutes a housing of an upper end or a lower end of the electronic device 100 is used as an antenna radiator, the cover window 110 may extend to the left and right side surfaces of the electronic device 100. In this case, similar to the above-mentioned example, metal areas of the left and right side surfaces, which are insulated by the insulator 174, may be utilized as antenna radiators.

Figure 2A:
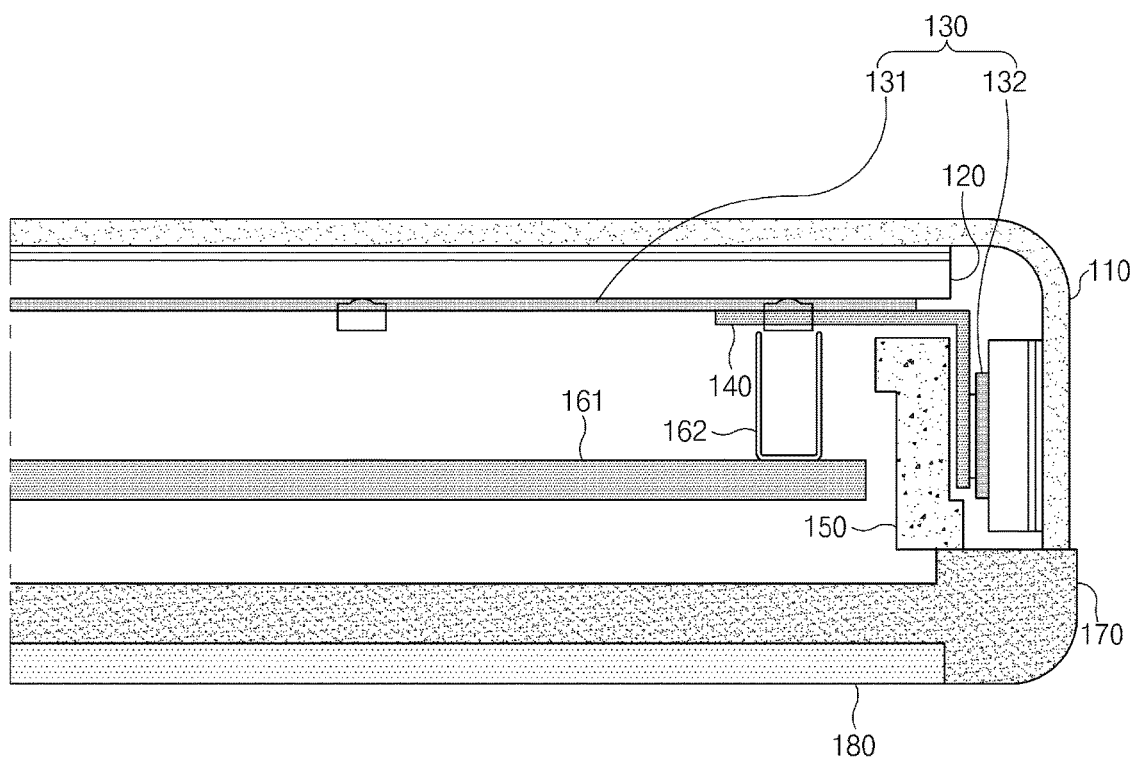
FIG. 2A illustrates a cross-sectional view of an electronic device, according to an embodiment of the present disclosure.

FIG. 2A illustrates a cross-sectional view of an electronic device, according to an embodiment of the present disclosure.

FIG. 2A may correspond to a cross-sectional view taken from the front surface to the rear surface of the electronic device 100. Referring to FIG. 2A, the cover window 110 may define a front surface and portions of side surfaces of the electronic device 100. The display panel 120 that is attached to the cover window 110 may be arranged on the front surface and the side surfaces of the electronic device 100. A metal panel 130 may be arranged under the display panel 120. For example, a first area 131 of the metal panel 130 may be attached to an area of the display panel 120, which corresponds to the front surface of the electronic device 100, and second area 132 of the metal panel 130 may be attached to areas of the display panel 120, which correspond to the side surfaces of the electronic device 100. When the first area 131 and the second area 132 are physically separated from each other, two or more metal panels 130 are arranged under the display panel 120. If the second area 132 is angled from one end of the first area 131, one metal panel 130 is arranged under the display panel 120.

According to an embodiment of the present disclosure, the first area 131 and the second area 132 may be bonded to the conductor 140. For bonding, a conductive tape may be interposed between the first area 131 and/or the second area 132, and the conductor 140.

The bonding force of the conductive tape may be weakened or the conductive tape may be detached when the electronic device 100 is assembled or if time elapses after the electronic device 100 is completely assembled. According to an embodiment of the present disclosure, damage to the bonding, which may occur during the assembling process or detachment of the conductive tape after the assembling process may be prevented, and examples of preventative methods will be described with reference to FIGS. 5, 6 and 7.

According to an embodiment of the present disclosure, the conductor 140 may be connected to the substrate 161. For example, the bracket 150 may be arranged between the conductor 140 and the substrate 161, and the conductor 140 and the substrate 161 may be electrically connected to each other through a connection member 162 situated in a hole of the bracket 150. A portion of the conductor 140 may be arranged between a side wall or a side surface of the bracket 150 and the second area of the metal panel 130. For example, when the conductor 140 includes a first planar portion that is coupled to the first area of the metal panel 130 and a second planar portion that is coupled the second area of the metal panel 130, the second planar portion may be arranged between the side wall of the bracket 150 and the second area of the metal panel 130. Further, the side wall of the bracket 150 and the second planar portion of the conductor 140 may be separated from each other by a gap.

According to an embodiment of the present disclosure, the communication circuit (e.g., a communication processor (CP) or a radio frequency (RF) module) arranged in the substrate 161 may be electrically connected to the conductor 140 and the second area 132. The communication circuit may supply electric power to an electrical path defined by the conductor 140 and the second area 132. Then, the first area 131 that is connected to the conductor 140 or connected to at least one point of the second area 132 may be utilized as a ground area of the antenna. Accordingly, the electronic device 100 may stably receive a signal of a targeted frequency band by utilizing the second area 132 and the conductor 140 as an antenna radiator and using the wide ground area of the first area 131.

According to an embodiment of the present disclosure, the electronic device 100 may have the following structure with reference to FIG. 2A. For example, the electronic device 100 includes a housing 110, 170, and 180 that includes a first surface that faces a first direction, a second surface that faces a second direction that is opposite to the first direction, and a side plate that faces a third direction that is substantially perpendicular to the first direction and surrounds a space between the first surface and the second surface. Further, the electronic device 100 includes a display 120 disposed in the housing and exposed through the first surface, a first plate 131 that is attached to the display 120 or is integrated into the display 120, and a second plate 132 that faces the third direction and is arranged adjacent to the side plate. The first plate 131 faces the first direction and includes a first periphery that extends along the side plate, and the second plate 132 may include a second periphery that extends along the first periphery.

The electronic device 100 includes a flexible printed circuit board 140 that includes a first planar portion coupled to the first plate 131 and a second planar portion coupled to the second plate 132 and angled from the first planar portion, a printed circuit board (PCB) 161 interposed between the display 120 and the second surface, and a mid-plate 150 that is arranged within the housing while supporting the PCB 161. The second planar portion of the FPCB 140 is inserted between a side surface of the mid-plate 150 and the second plate 132, and the side surface of the mid-plate 150 and the second planar portion of the FPCB 140 may be separated from each other by a gap.

According to an embodiment of the present disclosure, the side surface of the mid plate 150 may face the third direction or may have an angle other than 90 degrees. Further, the side surface of the mid-plate may be at least partially curved.

According to an embodiment of the present disclosure, at least one of the first plate and the second plate includes a conductive material, and in this case, the electronic device 100 may further include a wireless communication circuit that is electrically connected to the second plate, and the wireless communication circuit may be operated by using at least one of the first plate or the second plate as an antenna element.

Figure 2B:
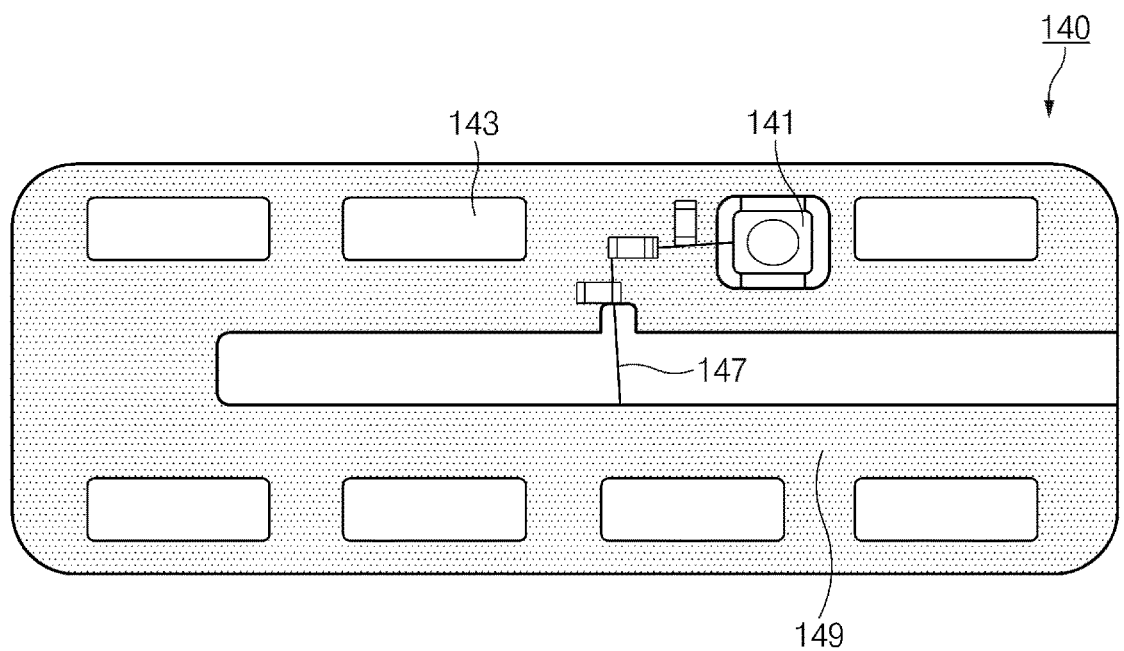
FIG. 2B illustrates a structure of a conductor that is connected to a metal panel, according to an embodiment of the present disclosure.

FIG. 2B illustrates a structure of conductor that is connected to a metal panel according to an embodiment of the present disclosure. The conductor 140 may correspond to an FPCB. The conductor 140 may be angled into a suitable shape to be coupled to the first area and the second area of the metal panel 130 and to be connected to other parts.

When the conductor 140 is implemented by an FPCB, a specific area may be exposed to supply electric power to the antenna element such as a radiator. The FPCB may include an RF transmitter/receiver circuit coupling area 141. Further, the FPCB may include an exposure area 143 for grounding. A plurality of exposure areas 143 may be provided, and at least some of the plurality of exposure areas 143 may be connected to the first area of the metal panel 130.

The supply line 147 may be connected to the RF transmission line coupling area 141 along an electrical path provided inside and outside the FPCB. A control circuit such as a wireless communication circuit may be electrically connected to the second area of the metal panel 130 through the supply line 147 and the RF transmission line coupling area 141.

Further, another surface of the FPCB may be implemented by a nonconductive area 149. Further, a central area of the conductor 140, through which the supply line 147 passes, also may be formed by the nonconductive area.

FIGS. 3A to 3D illustrate examples of a metal panel, according to an embodiment of the present disclosure.

The metal panel 130 is distinguished from the conductor 140, but the present disclosure is not limited to a metal plate. For example, the metal panel 130 may be replaced by, or constructed as, a conductive layer. Further, the metal panel 130 may be implemented by a conductive cover sheet. Accordingly, the metal panel 130 may be replaced by a first conductive member and the conductor 140 may be replaced by a second conductive member.

Figure 3A:
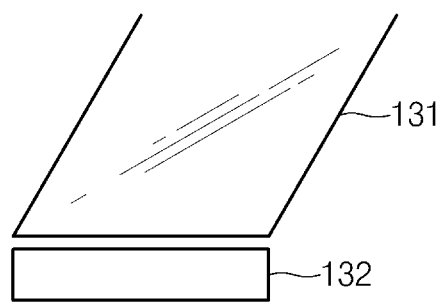
FIGS. 3A to 3D illustrate various metal panels, according to an embodiment of the present disclosure.

FIG. 3A illustrates a form of the metal panel 130 according to an embodiment of the present disclosure. The first area 131 may have dimensions and a location that correspond to those of a front area of the electronic device 100. Further, the second area 132 may be arranged to define a specific angle (e.g., 90 degrees) with the first area 131. The first area 131 and the second area 132, for example, may be electrically connected to each other by a conductor 140.

Figure 3B:
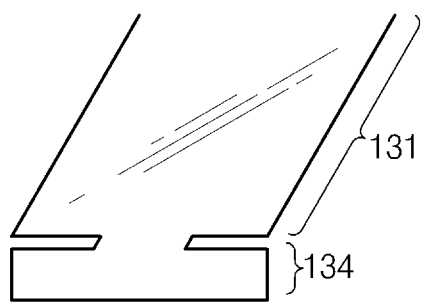

FIG. 3B illustrates a form in which the first area 131 and the second area 134 are connected to each other according to an embodiment of the present disclosure. The second area 134 may be angled from one end of the first area 131. The angled area may have a width that is the same as that of the first area 131, and may have a width that is less than that of the first area 131. Further, the second area 134 may have a width that corresponds to that of the first area 131, but the second area 134 may have a width that is less than that of the first area 131. The first area 131 and the second area 134 may have sizes and forms that correspond to the shape of the display panel 120.

Figure 3C:
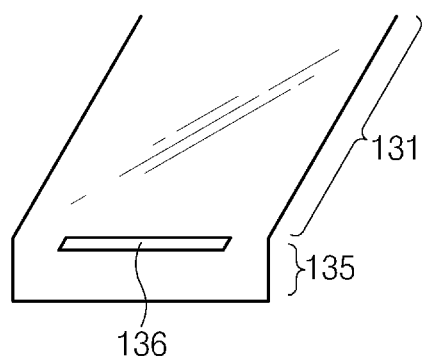

FIG. 3C illustrates a metal panel 130 that has a form in which the first area 131 and the second area 135 are connected to each other at two opposite ends of the metal panel 130. In this case, the metal panel 130 may include an opening 136. The second area 135 may operate as a slot antenna or a slit antenna based on a location of the supply provided by the conductor 140 that electrically contacts the metal panel 130.

Figure 3D:
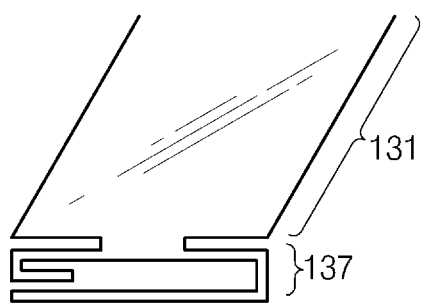

FIG. 3D illustrates a form in which the second area 137 includes a pattern for receiving a signal of one or more frequency bands, according to an embodiment of the present disclosure. For example, the second area 137 may include one or more branches that have different electrical lengths. For example, a branch having a relatively short path is adapted to receive a signal of a high frequency band, and a branch having a relatively long path is adapted to receive a signal of a low frequency band.

The structures of the metal panels 130 of FIGS. 3A to 3D are merely examples, and may be variously modified. For example, a slit antenna that is similar to that of FIG. 3C may be implemented by coupling the first area 131 and the second area 132 of FIG. 3A to the conductor 140 having a suitable shape. Further, the shapes of FIGS. 3B to 3D may be implemented directly by the structure or shape of the metal panel 130, but also may be implemented by the structure or shape that is formed through coupling of the metal panel 130 and the conductor 140.

Figure 4A:
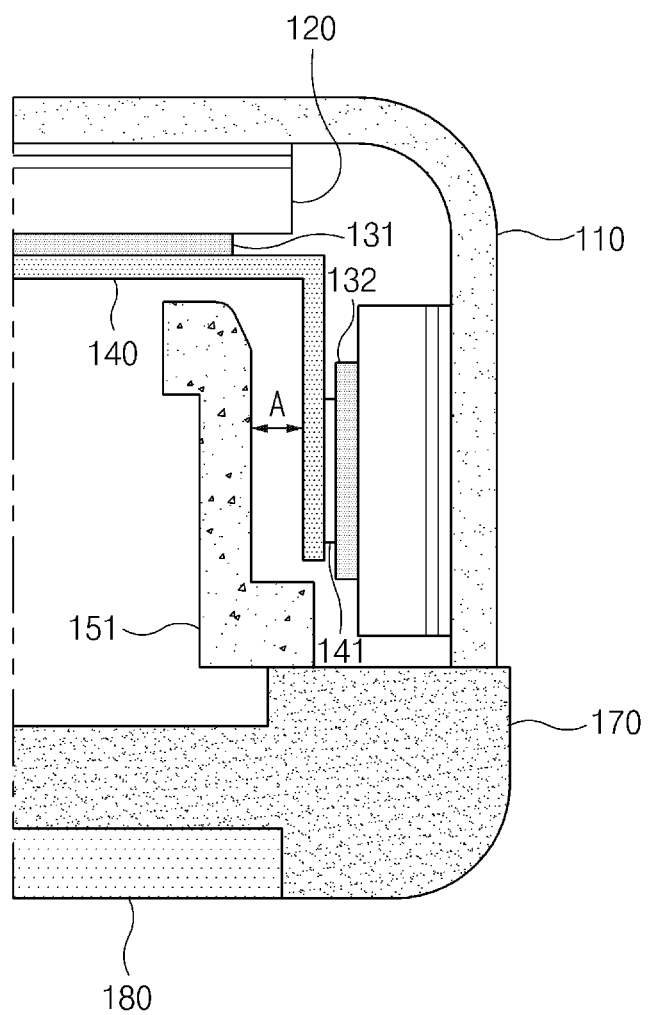
FIG. 4A illustrates a process of preventing a distortion or a crack of an antenna that may occur when an electronic device is assembled, according to an embodiment of the present disclosure.

FIG. 4A illustrates a process for preventing a distortion or a crack of an antenna that may occur when the electronic device 100 is assembled.

Referring to FIG. 4A, when an antenna radiator is arranged in a direction that is perpendicular to a front surface or a rear surface of the electronic device 100 according to an embodiment of the present disclosure, the antenna radiator may be prevented from being distorted, released from contact, or damaged in the process of assembling the electronic device 100. For example, the bracket 151 that maintains a gap A with the second area 132 and the substrate 161 may be coupled to each other. The substrate 161 may be coupled to the rear case 170.

The display panel 120 and the metal panel 130 including the first area 131 and the second area 132 may be coupled to each other. The conductor 140 may be bonded to the second area 132 by the conductive tape 141 while being attached to the first area 131.

A first module including the substrate 161 and the bracket 151 and a second module including the display panel 120, the metal panel 130, and the conductor 140 may be coupled to each other. The layers that are arranged in a direction that is parallel to the front of the electronic device 100 may be coupled without difficulty, but when the layers that are arranged vertically are coupled, the bonding portions may be damaged by friction and the like that is generated during the coupling process. However, because a gap of a specific size A or more is formed between the bracket 151 and the second area 132 or the conductor 140 in FIG. 4A, they may be prevented from being separated from bonding due to friction or the second area 132 may be prevented from being distorted.

Figure 4B:
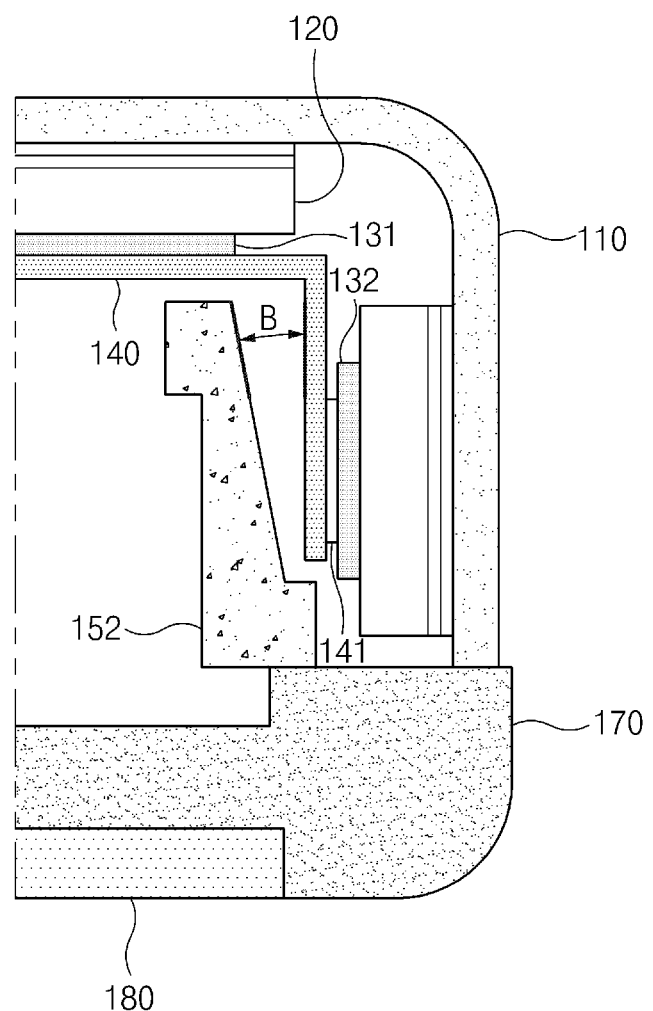
FIG. 4B illustrates a process of preventing distortion or damage to an antenna that may occur when an electronic device is assembled, according to another embodiment of the present disclosure.

FIG. 4B illustrates another example for preventing distortion or damage to an antenna that may occur when the electronic device 100 is assembled, according to an embodiment of the present disclosure. In the following description, the details that are the same as or similar to, or correspond to the above description may be omitted.

Referring to FIG. 4B, as compared with FIG. 4A, the bracket 152 may have a slope at a location corresponding to the second area 132. That is, when the module of the electronic device 100 is coupled with respect to a vertical direction, the bracket 152 and the second area 132 may have a gap of a specific size B or more at a location where the coupling starts. The slope of the bracket 152 may be set to gradually decrease along the progress direction of the coupling. When the electronic device 100 is coupled, an interior space of the electronic device 100, in which parts are mounted, may be further secured as compared with FIG. 4A, while damage of the electronic device 100 is prevented.

Figure 4C:
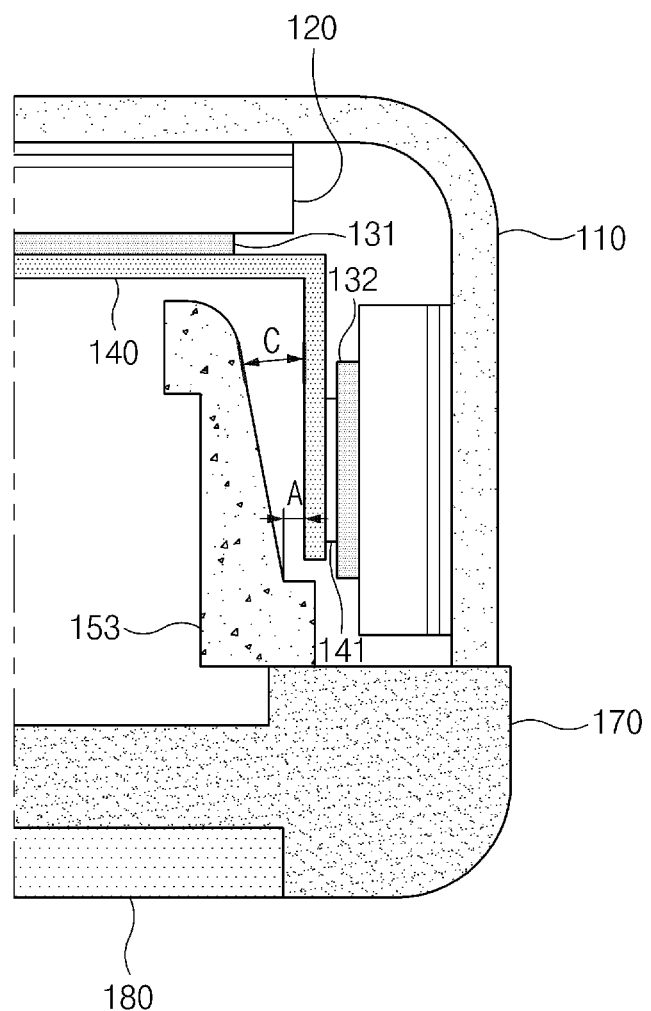
FIG. 4C illustrates a combination of FIGS. 4A and 4B, for preventing distortion or damage to an antenna that may occur when an electronic device is assembled, according to an embodiment of the present disclosure.

FIG. 4C illustrates a combination of FIGS. 4A and 4B, for preventing distortion or damage to an antenna that may occur when an electronic device is assembled, according to an embodiment of the present disclosure.

Referring to FIG. 4C, the bracket 153 may have a slope that allows the gap between the bracket 153 and the conductor 140 to be a minimum value A or more after the coupling is complete while the gap between the bracket 153 and the conductor 140 is made to be a specific size C or more at a location where the coupling starts. When the electronic device 100 is a tablet or a notebook PC that has a relatively large mounting space, distortion of an antenna that may occur during the coupling process may be prevented by adopting the structure of FIG. 4C.

In addition, various examples for preventing damage to an antenna in the coupling process and maintaining the durability of the antenna after the coupling will be described with reference to FIGS. 5A, 5B, 6, and 7.

Figure 5A:
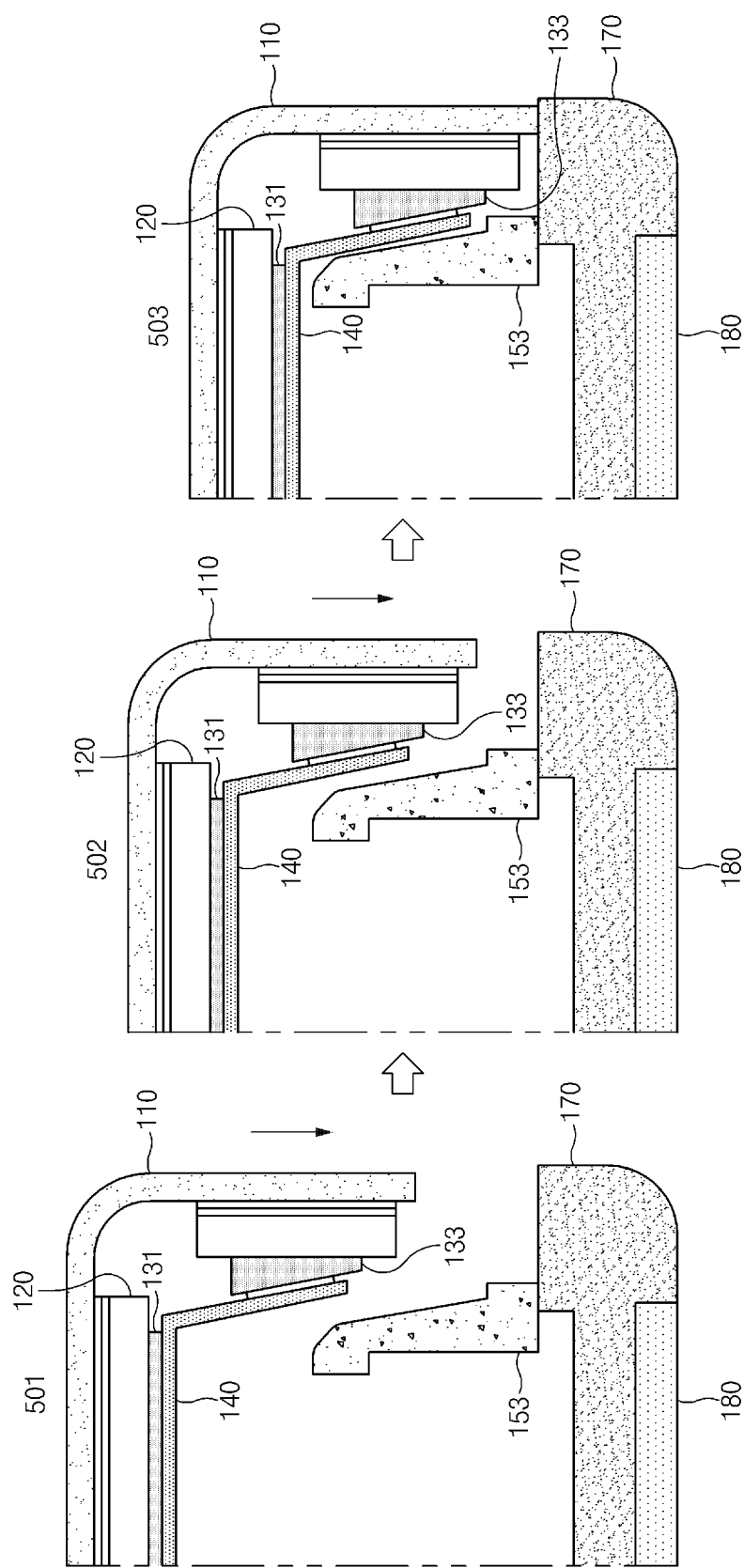
FIG. 5A illustrates a process of coupling an electronic device having a display antenna structure, according to an embodiment of the present disclosure.

FIG. 5A illustrates a process of coupling an electronic device having a display antenna structure, according to an embodiment of the present disclosure.

Referring to FIG. 5A, the electronic device 100 may be assembled by coupling a first module which includes the front cover window 110, the display panel 120, the metal panel 130, and the conductor 140, or in which the front cover window 110, the display panel 120, the metal panel 130, and the conductor 140 are coupled to each other, and a second module that includes the bracket 153, the components 160, the metal frame 170, and the rear cover 180. State 501 represents a state before the first module and the second module, which have been assembled, respectively, are coupled to each other, state 502 represents a state during the coupling, and state 503 represents a state after the first module and the second module are coupled to each other.

According to an embodiment of the present disclosure, the metal panel 130 may include a first area 131 and a second area 133. The second area 133 may have an uneven thickness as compared with the second area 132, for example, and may have a form in which an upper portion (a front side) of the second area 133 is thick and the second area 133 becomes thinner as it goes towards a lower portion (a rear side) thereof. The second area 133 may have a slope that is substantially the same as the slope of the bracket 153. The conductor 140 that is attached to the first area 131 and the second area 133 also may have an angle corresponding to the slope.

According to an embodiment of the present disclosure, the second area 133 (or the conductor 140 attached to the second area 133) and the bracket 153 have substantially the same slope, the second area 133 and the bracket 153 may maintain a parallel arrangement state during the coupling process in state 502. A resistant force that is applied from the bracket 153 towards the conductor 140 due to the coupling after the coupling is completed in state 503 may maintain the coupling of the second area 133 and the conductor 140.

Figure 5B:
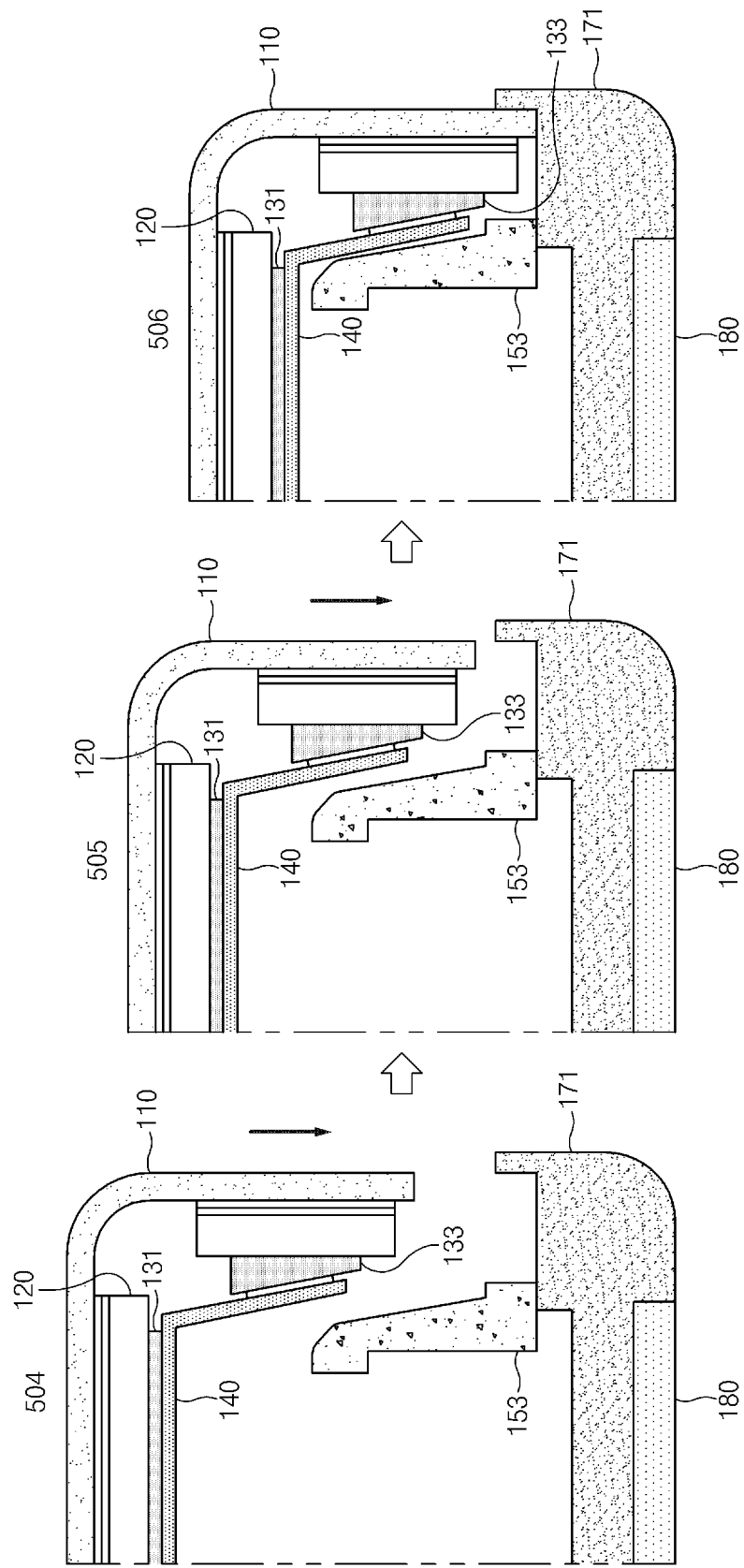
FIG. 5B illustrates a process of coupling an electronic device having a display antenna structure, according to another embodiment of the present disclosure.

FIG. 5B illustrates a process of coupling an electronic device having a display antenna structure according to another embodiment of the present disclosure.

Referring to FIG. 5B, the electronic device 100 may be assembled by coupling a first module including the front cover window 110, the display panel 120, the metal panel 130, and the conductor 140, and a third module including the bracket 153, the components 160, the metal frame 171, and the rear cover 180. State 504 represents a state before the first module and the third module, which have been assembled, respectively, are coupled to each other, state 505 represents a state during the coupling, and state 506 represents a state after the first module and the third module are coupled to each other.

Referring back to FIG. 5A, the resistant force generated after the coupling is completed may correspond to a force that maintains the coupling of the second area 133 and the conductor 140 and pushes the display module 120 and the cover window 110 outwards.

The metal frame 171 of FIG. 5B may define a rear housing of the electronic device 100 together with the rear cover 180, and may define a side housing of the electronic device 100 together with the cover window 110. The metal frame 171 may be arranged to cover at least a portion of the cover window 110. In this case, the metal frame 171 may prevent the cover window 110 from being pushed outwards and may maintain a stronger coupling of the second area 133 and the conductor 140.

In the present disclosure, the metal frame 170 and 171 may be replaced by a rear case unless specifically defined.

Here, the rear case may be implemented by a nonmetallic material or only a portion of the rear case may be implemented by a metallic material.

Figure 6:
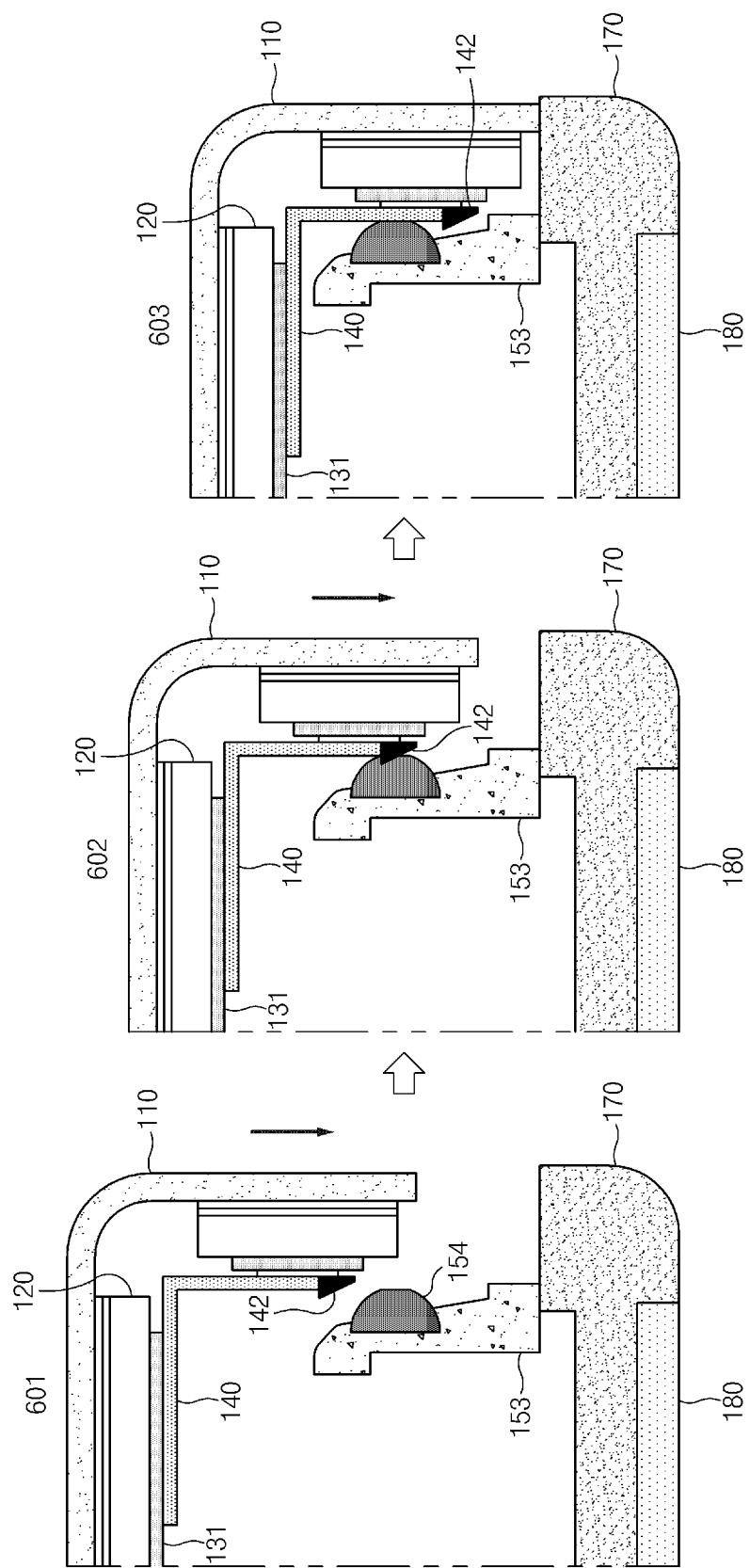
FIG. 6 illustrates a process of coupling an electronic device having a display antenna structure, according to another embodiment of the present disclosure.

FIG. 6 illustrates a process of coupling an electronic device having a display antenna structure according to another embodiment of the present disclosure.

As compared with FIG. 4B or 4C, FIG. 6 is a process of coupling the electronic device 100 when an elastic member 154 is attached to the bracket 153 and a rigid member 142 having a slope is attached to one end of the conductor 140. The shape of the elastic member 154 is shown as an example, and may be implemented by an arbitrary shape that may reinforce the bonding state by pressing the conductor 140.

Referring to FIG. 6, the electronic device 100, according to an embodiment of the present disclosure, may be assembled by coupling a first module including the front cover window 110, the display panel 120, the metal panel 130, the conductor 140, and the rigid member 142, and a second module including the bracket 153, to which the elastic member 154 is attached, the metal frame 170, and the rear cover 180. State 601 represents a state before the first module and the second module, which have been assembled, respectively, are coupled to each other, state 602 represents a state during the coupling, and state 603 represents a state after the first module and the second module are coupled to each other.

The rigid member 142 according to an embodiment of the present disclosure has a sharp shape towards the coupling direction to be coupled after passing by the resilient body and prevented from being separated in an opposite direction. That is, the rigid member 142 may have a shape by which the rigid member 142 may move in a first direction with respect to the elastic member 154 and cannot move in a direction that is opposite to the first direction. The elastic member 154 may be arranged to be attached to the rigid member 142 such that the rigid member 142 is prevented from moving in a reverse direction. The rigid member 142 may be omitted.

According to an embodiment of the present disclosure, the elastic member 154 may reinforce the coupling of the conductor 140 and the second area 132 and the rigid member 142 and may prevent the first module and the second module from being separated from each other or having a gap therebetween. Further, similar to FIG. 5B, the metal frame 170 instead of the metal frame 171 may prevent the front window 110 from being pushed.

Figure 7:
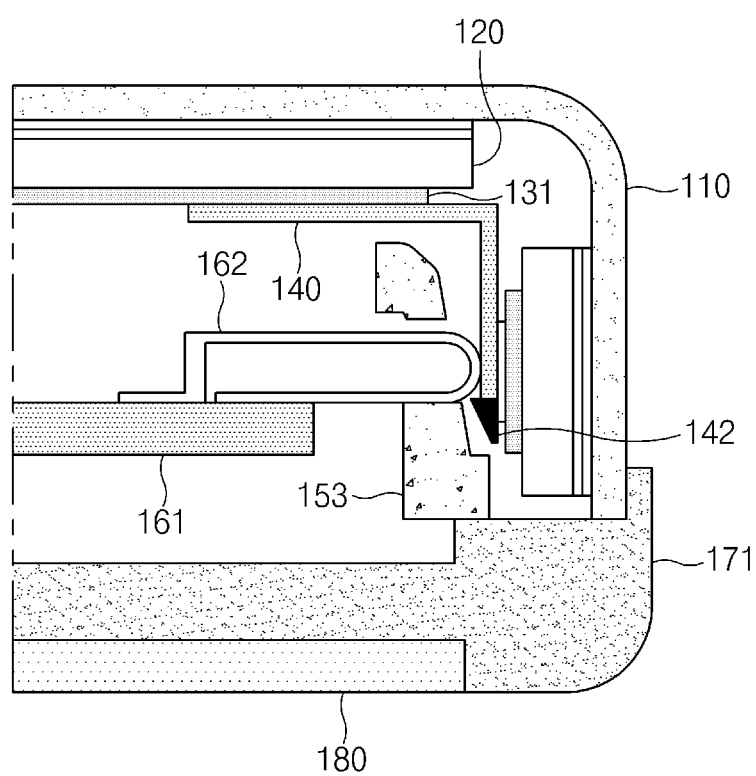
FIG. 7 illustrates an electronic device having a display antenna structure, according to an embodiment of the present disclosure.

FIG. 7 illustrates an electronic device having a display antenna structure according to an embodiment of the present disclosure.

Referring to FIG. 7, according to an embodiment of the present disclosure, an elastic member 162, such as a C-clip, may pass through a hole provided in the bracket 153 instead of attaching the elastic member 154 to the bracket 153. One end of the elastic member 162, may be fixed to the substrate 161. The elastic member 162 may reinforce the bonding of the conductor 140 and the second area 132 by applying a force to the conductor 140.

Although the electronic device 100 including the rigid member 142 and the metal frame 171 are illustrated in the example of FIG. 7, the rigid member 142 may be omitted or the metal housing 171 may be replaced by a housing (e.g., a metal housing 170) having another shape.

The electronic device 100 may include a cover window 110 that defines at least a portion of a side housing of the electronic device and a front housing of the electronic device, a display panel 120 that is arranged under the cover window, a metal panel 130 that is arranged under the display panel and comprises a first area 131 that is arranged parallel to the front housing and a second area 132 that defines a specific angle with the first area, a conductor 140 that is attached to a lower side of the first area and an inner side of the second area, an insulation member 150, 151, 152, and 153 that is arranged between the conductor 140 and a printed circuit board (PCB) and has an opening, and a control circuit 1120 that is arranged on the PCB and is electrically connected to the conductor through a connection member provided through the opening.

In an embodiment of the present disclosure, the first area and the second area may be physically separated from each other, and the second area may correspond to an area that is angled from at least one end of the first area.

In an embodiment, the conductive member and the second area may define at least one electrical path for receiving a signal of a specific frequency band. In this case, the electronic device may correspond to a ground for the at least one electrical path.

In an embodiment of the present disclosure, the insulation member 151 may define a gap of a specific size or more with an inside of the second area, and the insulation member 152 may define a specific inclination with the inside of the second area.

In an embodiment of the present disclosure, the electronic device 100 may further include a rear case 170, 171, and 180 that is arranged under the PCB and defines at least a portion of the side housing of the electronic device and a rear housing of the electronic device. In this case, the rear case 171 may cover at least a portion of the front window on a side surface of the electronic device.

In an embodiment of the present disclosure, the electronic device 100 may further include an elastic member 154 that is attached to the insulation member, and the elastic member may be arranged to press the conductor on the second area. Further, a rigid member 142 may be attached to one end of the conductor, and the rigid member 142 may be shaped to be movable in the first direction with respect to the elastic member and not to be movable in a direction that is opposite to the first direction.

In an embodiment of the present disclosure, the electronic device 100 may further include an elastic member 162 one end of which is fixed onto the PCB and which contacts the conductor through the insulation member, and the elastic member 162 is arranged to press the conductor on the second area.

Figure 8:
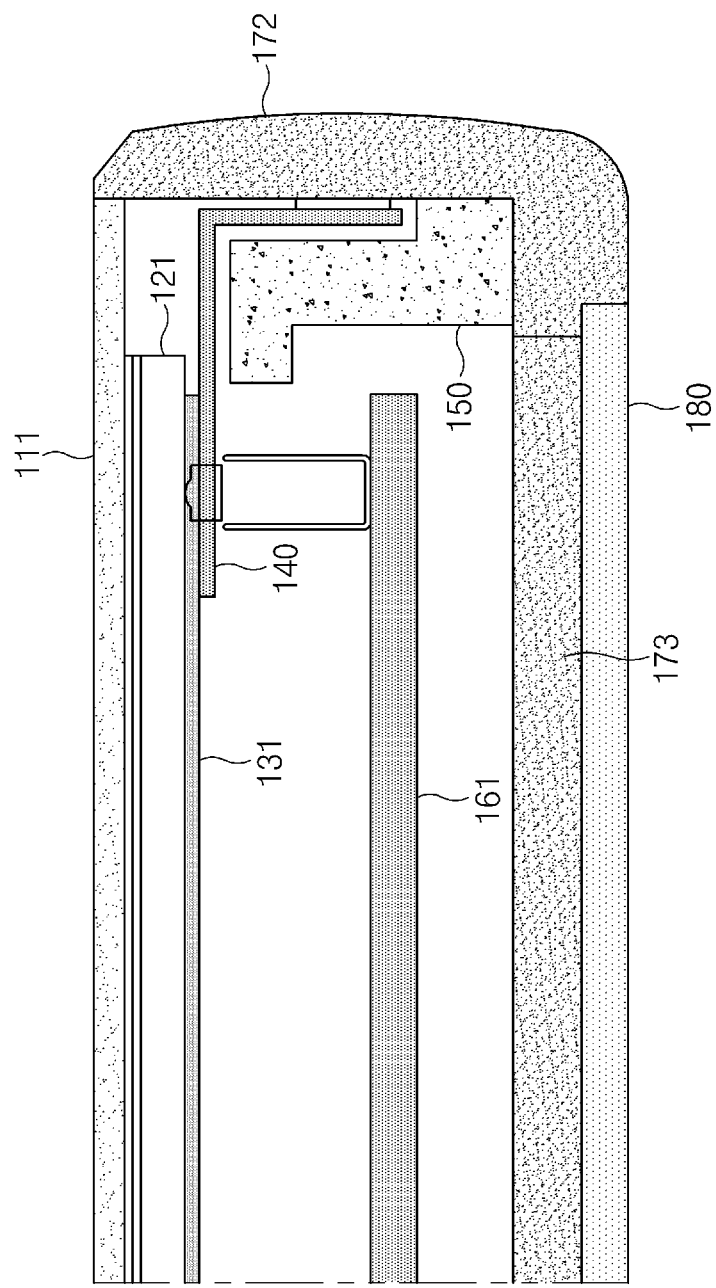
FIG. 8 illustrates an electronic device that utilizes a side metal frame as an antenna, according to an embodiment of the present disclosure.

FIG. 8 illustrates an electronic device that utilizes a side metal frame as an antenna according to an embodiment of the present disclosure.

According to an embodiment of the present disclosure, the cover window 111 may define a front housing of the electronic device 100. When the electronic device 100 has several side surfaces (for example, four side surfaces), the cover window 111 also may define at least a portion of the side housing including the cover window 110. At least one side housing is defined by the metal frame 172, the metal frame 172 may cover a portion of the at least one side housing, which corresponds to an area (such as height). In this case, the remaining area of the housing, which is not covered by the metal frame 172, may be covered by the cover window 111 or the nonmetal frame 173. Hereinafter, the example of FIG. 8 will be described.

According to an embodiment of the present disclosure, the display panel 121 may be arranged under the cover window 111. A metal panel 131 may be arranged under the display panel 121. The metal panel 131 may be substantially the same as the above-described first area 131 of the metal panel 130.

According to an embodiment of the present disclosure, the conductor 140 may be arranged under the metal panel 131. Further, one end of the conductor 140 may be angled to electrically contact the metal frame 172. A conductive tape may be used to bring the conductor 140 and the metal frame into contact with each other.

According to an embodiment of the present disclosure, a bracket 150 may be arranged between the substrate 161 and the conductor 140. The bracket 150 has an opening, and the substrate 161 and the conductor 140 may be electrically connected to each other through a connection member (e.g., a C clip) arranged in the opening.

According to an embodiment of the present disclosure, a control circuit such as a communication circuit may be arranged in the substrate 161. The control circuit may provide electric power to at least one electrical path defined by the conductor 140 and the metal frame 172 through the connection member. The metal panel 131 may function as a ground area for the electrical path.

The electronic device 100 includes a cover window 110 that defines a front housing of the electronic device, a display panel 121 that is arranged under the cover window, a metal panel 131 that is arranged under the display panel and is arranged parallel to the front housing, a conductor 140 which is attached to a lower side of the metal panel and one end of which is angled to electrically contact the metal frame, an insulation member 150 that is arranged between the conductor and a printed circuit board (PCB) and has an opening, and a control circuit 1120 that is arranged on the PCB and is electrically connected to the conductor through a connection member provided through the opening. The conductor and the metal frame define at least one electrical path for receiving a signal of a specific frequency band, and the metal panel may correspond to a ground for the electrical path.

Figure 9:
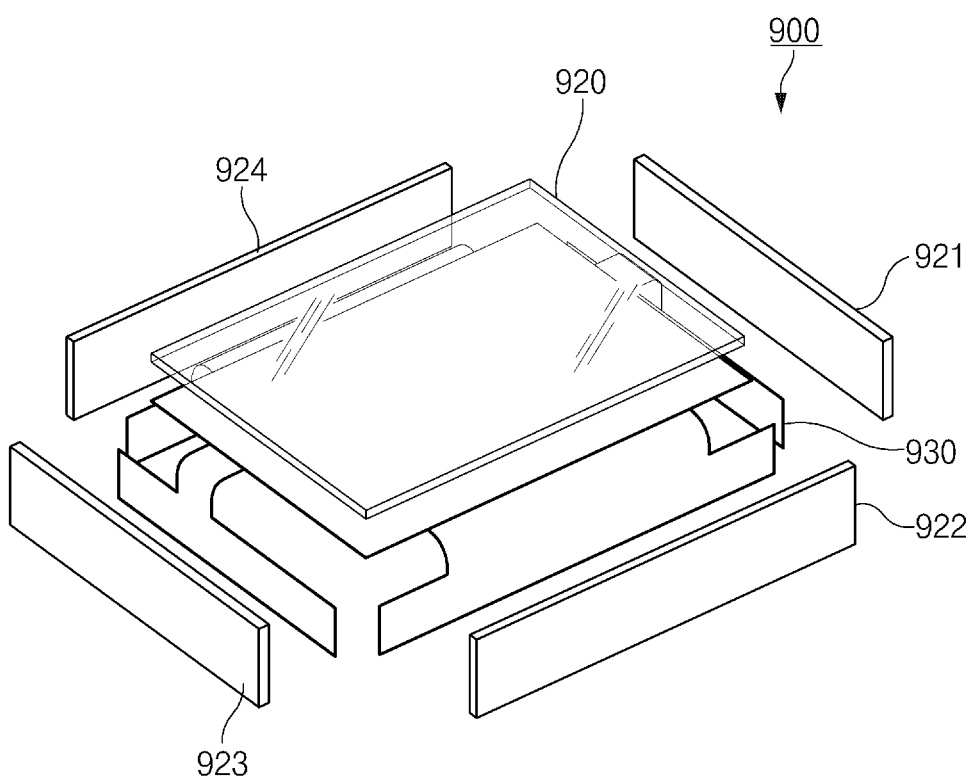
FIG. 9 illustrates an antenna structure of an electronic device having a plurality of side displays, according to an embodiment of the present disclosure.

FIG. 9 illustrates an antenna structure of an electronic device having a plurality of side displays, according to an embodiment of the present disclosure.

Referring to FIG. 9, the electronic device 900 may have displays on four side surfaces, in addition to a front surface. For example, the electronic device 900 includes a front display panel 920, and side display panels 921, 922, 923, and 924. Although FIG. 9 illustrates that the panels are all separated, the display of the electronic device 900 may be implemented by one panel or not more than four panels. For example, the front display panel 920 and the side display panel 922 may be implemented by one flexible display panel.

According to an embodiment of the present disclosure, a metal panel 930 may be arranged under the display panels. The metal panel 930 may be one metal panel that is curved at the four sides thereof, and may include five metal panels that are separately provided at the sides thereof.

According to an embodiment of the present disclosure, the electronic device 900 may utilize one or more metal panels as antenna radiators. For example, the electronic device 900 may utilize a relatively long right side metal panel (e.g., a metal panel corresponding to the display panel 922) as a radiator for receiving a signal of a low frequency band, and may utilize a relatively short upper end metal panel (e.g., a metal panel corresponding to the display panel 921) as a radiator for receiving a signal of a high frequency band. The metal panel area corresponding to the front display panel 920 may function as a ground area for the radiators. At least one or a combination of one or more of the above-described methods may be used to utilize the metal panels as radiators.

Figure 10:
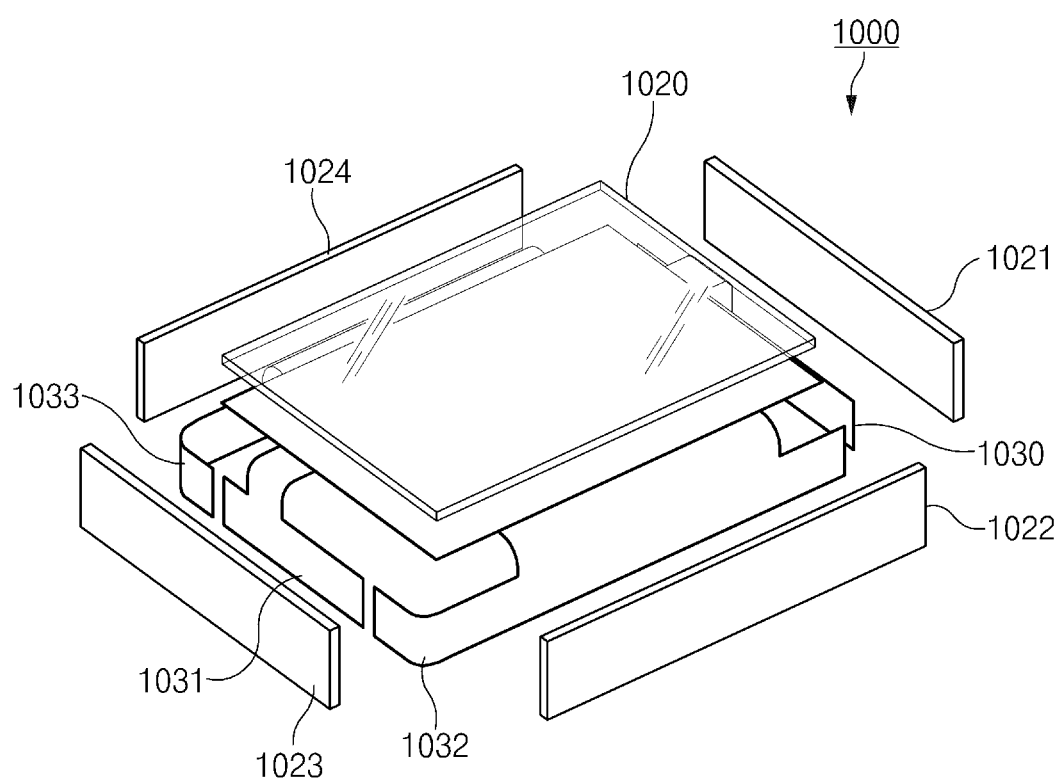
FIG. 10 illustrates an antenna structure of an electronic device having a plurality of side displays according to another embodiment of the present disclosure.

FIG. 10 illustrates an antenna structure of an electronic device having a plurality of side displays, according to another embodiment of the present disclosure.

The electronic device 1000 of FIG. 10 may have a configuration corresponding to the electronic device 900 of FIG. 9. The front display panel 1020 and the side display panels 1021, 1022, 1023, and 1024 of the electronic device may correspond to the front display panel 920 and the side display panels 921, 922, 923, and 924 of the electronic device 900. Hereinafter, the details that correspond to, or are the same as or similar to, those of FIG. 9 will be omitted.

A metal panel 1030 may be arranged under the display panels. The metal panel 1030 may be one metal panel that is curved at the four sides thereof, and may include five metal panels that are separately provided at the sides thereof.

The metal panel 1030 may have a structure that is curved to form one surface to another surface thereof. For example, the metal panel, which is expanded from the metal planar portion arranged under the front display panel 1020 to the four sides, may be expanded to be adjacent to another side. For example, the metal panel area 1032 that is formed at a location corresponding to the side display panel 1022 may extend in the direction of another side display panel 1023. Similarly, the metal panel area 1035, which is formed at a location corresponding to the side display panel 1033, also may extend in the direction of the side display panel 1023. In this case, the length of the metal panel area 1031 corresponding to the side display panel 1023 may be less than that shown in FIG. 9. Through the modification, the electronic device 1000 may receive a signal of a low frequency band by using the metal panel area 1032 or the metal panel area 1033, and may receive a signal of a high frequency band by using the metal panel area 1031. In this case, the planar metal panel arranged under the display panel 1020 may function as a ground area of the antenna.

Figure 11:
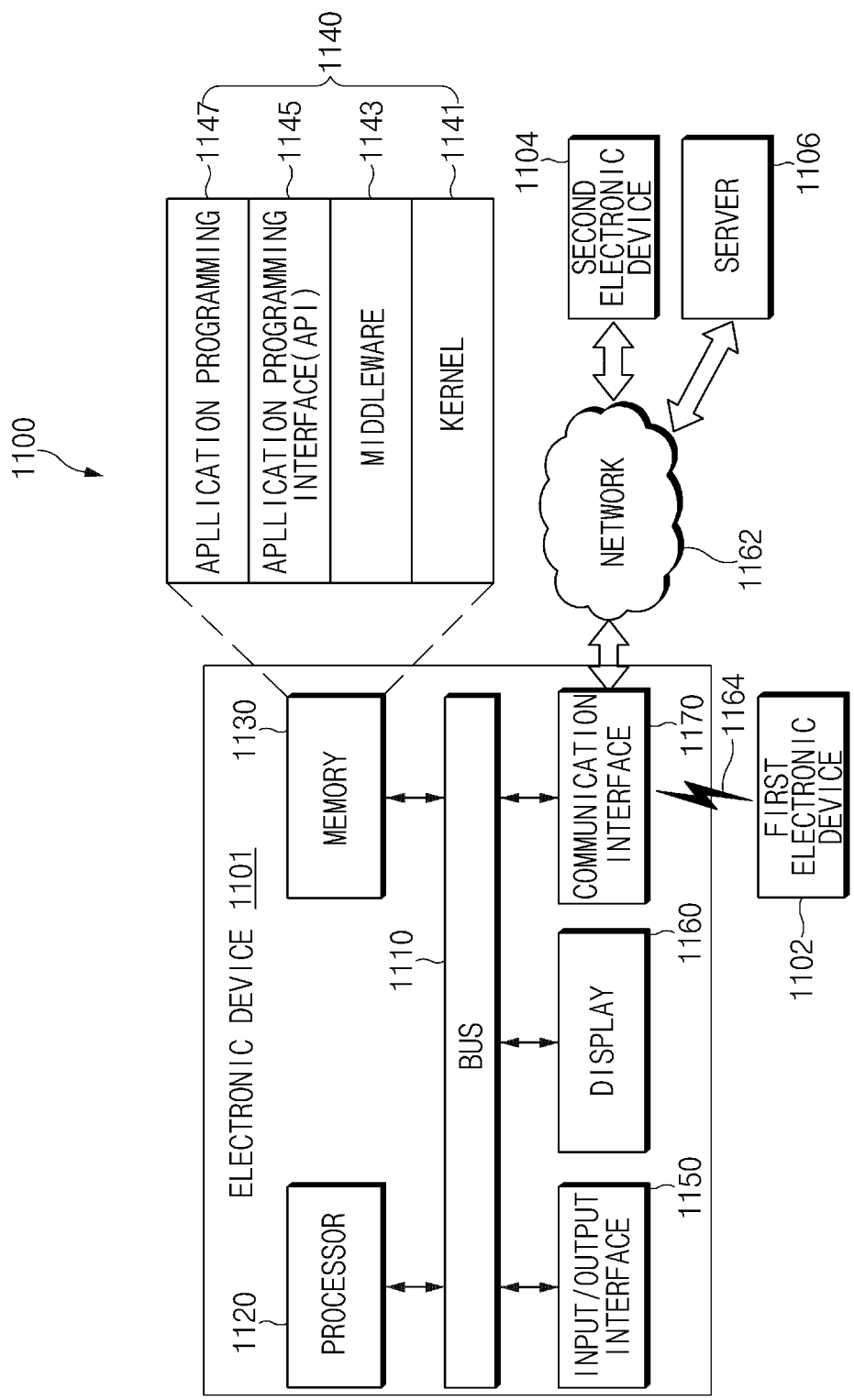
FIG. 11 illustrates an electronic device in a network environment, according to an embodiment of the present disclosure.

FIG. 11 illustrates an electronic device in a network environment, according to an embodiment of the present disclosure.

The electronic device of FIG. 11 may correspond to the electronic device 100 of FIG. 1A and the like. Further, the illustrated components may be examples of the components 160.

Referring to FIG. 11, the electronic device 1101, a first electronic device 1102, a second electronic device 1104, and the server 1106, according to an embodiment of the present disclosure, may be connected to each other through a network 1162 or a short range communication 1164. Referring to FIG. 1, the electronic device 1101 includes a bus 1110, a processor 1120, a memory 1130, an input/output interface 1150, a display 1160, and a communication interface 1170. The electronic device 1101 may exclude at least one of the elements or may additionally include other elements.

The bus 1110 may include, for example, a circuit that connects the components 1110 to 1170 and transfers communications (e.g., control messages and/or data) between the components.

The processor 1120 may include one or more of a central processing unit (CPU), an application processor (AP), or a communication processor (CP). The processor 1120, for example, may execute operations or data processing related to the control and/or communication of at least one other component of the electronic device 1101.

The memory 1130 may include volatile and/or nonvolatile memories. The memory 1130, for example, may store a command or data related to at least one other component of the electronic device 1101. According to an embodiment of the present disclosure, the memory 1130 may store software and/or a program 1140. The program 1140, for example, includes a kernel 1141, middleware 1143, an application programming interface (API) 1145, and/or an application program (or an application) 1147. At least some of the kernel 1141, the middleware 1143, or the API 1145 may be referred to as an operating system (OS).

The kernel 1141, for example, may control or manage system resources (e.g., the bus 1110, the processor 1120, and the memory 1130) that are used to execute operations or functions implemented in the other programs (e.g., the middleware 1143, the API 1145, or the applications 1147). The kernel 1141 may provide an interface through which the middleware 1143, the API 1145, or the applications 1147 access individual components of the electronic device 1101 to control or manage the system resources.

The middleware 1143, for example, may function as an intermediary that allows the API 1145 or the applications 1147 to communicate with the kernel 1141 to exchange data.

The middleware 1143 may process one or more work requests received from the application programs 1147, according to their priorities. For example, the middleware 1143 may give a priority, by which a system resource (e.g., the bus 1110, the processor 1120, or the memory 1130) of the electronic device 1101 may be used, to at least one of the application programs 1147. For example, the middleware 1143 may perform scheduling or load balancing for the one or more work requests by processing the one or more work requests according to the priority given to the at least one of the application programs 1047.

The API 1145 is an interface used, by the application 1147, to control a function provided by the kernel 1141 or the middleware 1143, and may include, for example, at least one interface or function (e.g., an instruction), for example, for file control, window control, image processing, and text control.

The input/output interface 1150, for example, may function as an interface that may transfer a command or data that are input from the user or another external device to another element (other elements) of the electronic device 1101. The input/output interface 1150 may output a command or data received from another component (other elements) of the electronic device to the user or anther external device 1101.

The display 1160, for example, may include an LCD, an LED display, an OLED display, a microelectromechanical system (MEMS) display, or an electronic paper display. The display 1160, for example, may display various content (e.g., a text, an image, a video, an icon, and a symbol). The display 1160 may include a touch screen and receive, for example, a touch, a gesture, a proximity, or a hovering input using an electronic pen or the user's body.

The communication interface 1170, for example, may establish communication between the electronic device 1101 and a first external electronic device 1102, a second external electronic device 1104, or a server 1106. For example, the communication interface 1170 may be connected to a network 1162 through a wireless communication or a wired communication to communicate with the second external electronic device 1104 or the server 1106.

The wireless communication is, for example, a cellular communication protocol, and, for example, may use at least one of long-term evolution (LTE), LTE-advanced (ATE-A), code division multiple access (CDMA), wideband CDMA (WCDMA), a universal mobile telecommunications system (UMTS), wireless broadband (WiBro), or a global system for mobile communications (GSM). Furthermore, the wireless communication, for example, may include a short range communication 1164. The short range communication 1164 may include at least one of wireless fidelity (Wi-Fi), Bluetooth, near field communication (NFC), magnetic stripe transmission (MST), or GNSS.

An MST may generate a pulse according to transmission data by using an electromagnetic signal, and the pulse may generate a magnetic field signal. The electronic device 1101 may transmit the magnetic field signal to a point of sales (POS) device, detect the magnetic field signal by using an MST reader, and restore the data by converting the detected magnetic signal into an electrical signal.

The GNSS may include at least one of, for example, a global positioning system (GPS), a global navigation satellite system (Glonass), a Beidou navigation satellite system (Beidou), or the European global satellite-based navigation system (Galileo), according to a use area or a bandwidth. Hereinafter, in the present disclosure, the term "GPS" may be interchangeably used with the term "GNSS". The wired communication may include at least one of, for example, a universal serial bus (USB), a high definition multimedia interface (HDMI), recommended standard-232 (RS-232), and a plain old telephone service (POTS). The network 1162 may include at least one of communication networks, for example, a computer network (e.g., a LAN or a WAN), the Internet, or a telephone network.

The first and second electronic devices 1102 and 1104 may be of the type that is the same as, or different from, that of the electronic device 1101. According to an embodiment of the present disclosure, the server 1106 may include a group of one or more servers. All or some of the operations executed by the electronic device 1101 may be executed by another or a plurality of electronic devices (e.g., the first electronic device 1102 and the second electronic device 1104 or the servers 1106). When the electronic device 1101 should execute some functions or services automatically or upon request, it may request at least some functions associated with the functions or services from the first electronic device 1102 and the second electronic device 1104 or the servers 1106, in place of, or in addition to, directly executing the functions or services. The other electronic device may execute a requested function or an additional function, and may deliver the result to the electronic device 1101. The electronic device 1101 may process the received result directly or additionally, and may provide a requested function or service. To this end, for example, the cloud computing, distributed computing, or client-server computing technologies may be used.

Figure 12:
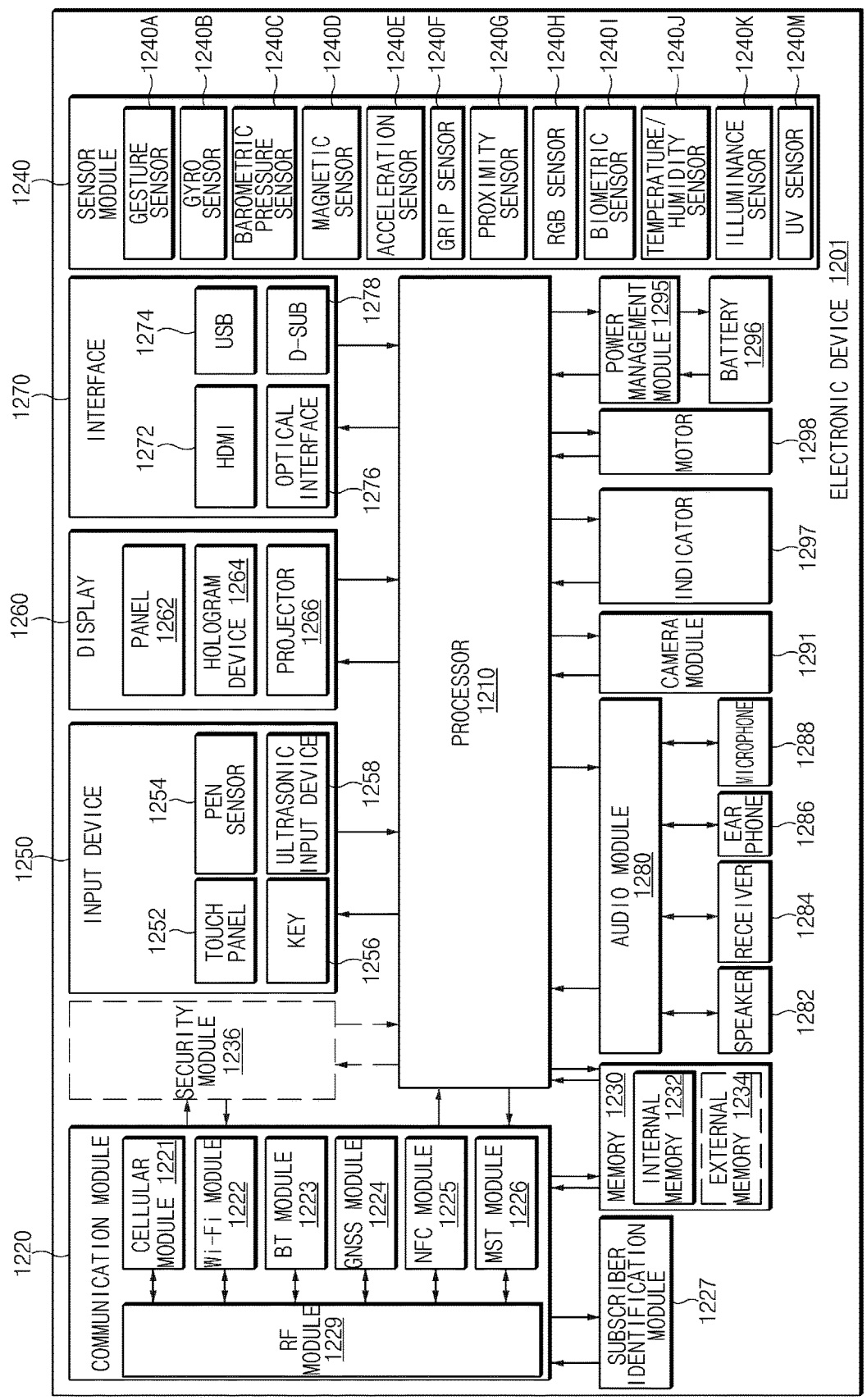
FIG. 12 is a block diagram of an electronic device, according to an embodiment of the present disclosure.

FIG. 12 is a block diagram of an electronic device according to an embodiment of the present disclosure.

Referring to FIG. 12, an electronic device 1201 may include, for example, the whole part or a part of the electronic device 1101 illustrated in FIG. 11. The electronic device 1201 includes at least one application processor (AP) 1210, a communication module 1220, a SIM card 1227, a memory 1230, a sensor module 1240, an input device 1250, a display 1260, an interface 1270, an audio module 1280, a camera module 1291, a power management module 1295, a battery 1296, an indicator 1297, or a motor 1298.

The processor 1210 may control a plurality of hardware or software components connected to the processor 1210 by driving an operating system or an application program and perform a variety of data processing and calculations. The processor 1210 may be implemented by, for example, a system on chip (SoC). According to an embodiment of the present disclosure, the processor 1210 may further include a graphical processing unit (GPU) and/or an image signal processor. The processor 1210 may include at least some (e.g., a cellular module 1221) of the components illustrated in FIG. 12. The processor 1210 may load instructions or data, received from at least one other component (e.g., a non-volatile memory), in a volatile memory to process the loaded instructions or data, and may store various types of data in a non-volatile memory.

The communication module 1220 may have the same or similar structure as the communication interface 1170 of FIG. 11. The communication module 1220 includes, for example, a cellular module 1221, a Wi-Fi module 1222, a Bluetooth module 1223, a GNSS module 1224 (e.g., a GPS module, a Glonass module, a Beidou module, or a Galileo module), an NFC module 1225, an MT module 1126, and a radio frequency (RF) module 1229.

The cellular module 1221 may provide a voice call, a video call, a text message service, or an Internet service through, for example, a communication network. According to an embodiment of the present disclosure, the cellular module 1221 may distinguish between and authenticate electronic devices 1201 within a communication network using a SIM 1227. The cellular module 1221 may perform at least some of the functions that the processor 1210 may provide. The cellular module 1221 may include a communication processor (CP).

Each of the Wi-Fi module 1222, the Bluetooth module 1223, the GNSS module 1224, the NFC module 1225, or the MST module 1226, for example, may include a processor for processing data transmitted/received through the corresponding module. According to an embodiment of the present disclosure, at least some (e.g. two or more) of the cellular module 1221, the Wi-Fi module 1222, the Bluetooth module 1223, the GNSS module 1224, the NFC module 1225, and the MST module 1226 may be included in one integrated chip (IC) or IC package.

The RF module 1229 may transmit/receive, for example, a communication signal (e.g., an RF signal). The RF module 1229 may include, for example, a transceiver, a power amp module (PAM), a frequency filter, a low noise amplifier (LNA), or an antenna. At least one of the cellular module 1221, the Wi-Fi module 1222, the Bluetooth module 1223, the GNSS module 1224, the NFC module 1225, or the MST module 1226 may transmit and receive an RF signal through a separate RF module 1229.

The SIM 1227 may include, for example, a card including a SIM and/or an embedded SIM, and may further include unique identification information (e.g., an integrated circuit card identifier (ICCID)) or subscriber information (e.g., international mobile subscriber identity (IMSI)).

The memory 1230 (e.g., the memory 1130) includes, for example, an internal memory 1232 or an external memory 1234. The internal memory 1232 may include at least one of, for example, a volatile memory (e.g., a dynamic random access memory (DRAM), a static RAM (SRAM), a synchronous dynamic RAM (SDRAM), and the like) and a non-volatile memory (e.g., a one-time programmable read only Memory (OTPROM), a programmable ROM (PROM), an erasable and programmable ROM (EPROM), an electrically erasable and programmable ROM (EEPROM), a flash memory (e.g., a NAND flash memory or a NOR flash memory), a hard driver, or a solid state drive (SSD).

The external memory 1234 may further include a flash drive, for example, a compact flash (CF), a secure digital (SD), a micro secure digital (Micro-SD), a mini secure digital (Mini-SD), an extreme digital (xD), a memory stick, or the like. The external memory 1234 may be functionally and/or physically connected to the electronic device 1201 through various interfaces.

The security module 1236 is a module including a storage space having a relatively high security level as compared with the memory 1230, and may be a circuit that guarantees safe data storage and a protected execution environment. The security module 1236 may be implemented by a separate circuit, and may include a separate processor. The security module 1236, for example, may be present in a detachable smart chip or a secure digital (SD) card, or may include an embedded secure element (eSE) embedded in a fixed chip of the electronic device 1201. Further, the security module 1236 may be driven by an operation system (OS) that is different from the operating system of the electronic device 1201. For example, the security module 1236 may be operated based on a java card open platform (JCOP) operating system.

The sensor module 1240, for example, may measure a physical quantity or detect an operational state of the electronic device 1201, and may convert the measured or detected information to an electrical signal. The sensor module 1240 includes, for example, at least one of a gesture sensor 1240A, a gyro sensor 1240B, an atmospheric pressure sensor 1240C, a magnetic sensor 1240D, an acceleration sensor 1240E, a grip sensor 1240F, a proximity sensor 1240G, a color sensor 1240H (for example, an RGB sensor), a biometric sensor 1240I, a temperature/humidity sensor 1240J, an illumination sensor 1240K, and an ultraviolet (UV) sensor 1240M. Additionally or alternatively, the sensor module 1240 may include an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 1240 may further include a control circuit for controlling one or more sensors included therein. The electronic device 1201 may further include a processor configured to control the sensor module 1240 as a part of or separately from the processor 1210, and may control the sensor module 1240 while the processor 1210 is in a sleep state.

The input device 1250 may include, for example, a touch panel 1252, a (digital) pen sensor 1254, a key 1256, or an ultrasonic input device 1258. The touch panel 1252 may use at least one of, for example, a capacitive type, a resistive type, an infrared type, and an ultrasonic type. The touch panel 1252 may further include a control circuit. The touch panel 1252 may further include a tactile layer, and provide a tactile reaction to a user.

The (digital) pen sensor 1254 may include, for example, a recognition sheet which is a part of the touch panel or a separate recognition sheet. The key 1256 may include, for example, a physical button, an optical key, or a keypad. The ultrasonic input device 1258 may detect ultrasonic waves generated by an input tool through a microphone 1288 and may identify data corresponding to the detected ultrasonic waves.

The display 1260 (e.g., the display 1160) may include a panel 1262, a hologram device 1264, or a projector 1266. The panel 1262 may include a component equal or similar to the display 1160 of FIG. 11. The panel 1262 may be implemented to be, for example, flexible, transparent, or wearable. The panel 1262 may be formed as a single module together with the touch panel 1252. The hologram device 1264 may show a three dimensional image in the air using an interference of light. The projector 1266 may display an image by projecting light onto a screen. The screen may be located, for example, in the interior of or on the exterior of the electronic device 1201. According to an embodiment of the present disclosure, the display 1260 may further include a control circuit for controlling the panel 1262, the hologram device 1264, or the projector 1266.

The interface 1270 may include, for example, a high-definition multimedia interface (HDMI) 1272, a universal serial bus (USB) 1274, an optical interface 1276, or a D-subminiature (D-sub) 1278. The interface 1270 may be included in, for example, the communication interface 1170 illustrated in FIG. 11. Additionally or alternatively, the interface 1270 may include, for example, a mobile high-definition link (MHL) interface, a secure digital (SD) card/multimedia card (MMC) interface, or an infrared data association (IrDA) standard interface.

The audio module 1280 may bilaterally convert, for example, a sound and an electrical signal. At least some elements of the audio module 1280 may be included in, for example, the input/output interface 1150 illustrated in FIG. 11. The audio module 1280 may process sound information input or output through, for example, a speaker 1282, a receiver 1284, earphones 1286, the microphone 1288, and the like.

The camera module 1291 is a device which may photograph a still image and a dynamic image. According to an embodiment of the present disclosure, the camera module 291 may include one or more image sensors (e.g., a front sensor or a back sensor), a lens, an image signal processor (ISP) or a flash (e.g., an LED or xenon lamp).

The power management module 1295 may manage, for example, power of the electronic device 1201. According to an embodiment of the present disclosure, the power management module 1295 may include a power management integrated circuit (PMIC), a charger integrated circuit (IC), or a battery gauge. The PMIC may have a wired and/or wireless charging scheme. Examples of the wireless charging method may include, for example, a magnetic resonance method, a magnetic induction method, an electromagnetic wave method, and the like. Additional circuits (for example, a coil loop, a resonance circuit, a rectifier, etc.) for wireless charging may be further included. The battery gauge may measure, for example, a residual charge quantity of the battery 1296, and a voltage, a current, or a temperature while charging. The battery 1296 may include, for example, a rechargeable battery and/or a solar battery.

The indicator 1297 may indicate particular status of the electronic device 1201 or a part thereof (e.g., the processor 1210), for example, a booting status, a message status, a charging status, or the like. The motor 1298 may convert an electrical signal into mechanical vibrations, and may generate a vibration or haptic effect. The electronic device 1201 may include a processing device (e.g., a GPU) for supporting mobile TV. The processing unit for supporting mobile TV may process, for example, media data pursuant to a certain standard of digital multimedia broadcasting (DMB), digital video broadcasting (DVB), or MediaFlo™.

Each of the elements described in the specification may include one or more components, and the terms of the elements may be changed according to the type of the electronic device. In an embodiment of the present disclosure, the electronic device may include at least one of the elements described in the specification, and some elements may be omitted or additional elements may be further included. Some of the elements of the electronic device may be coupled to form one entity, and may perform the same functions of the corresponding elements before they are coupled.

Figure 13:
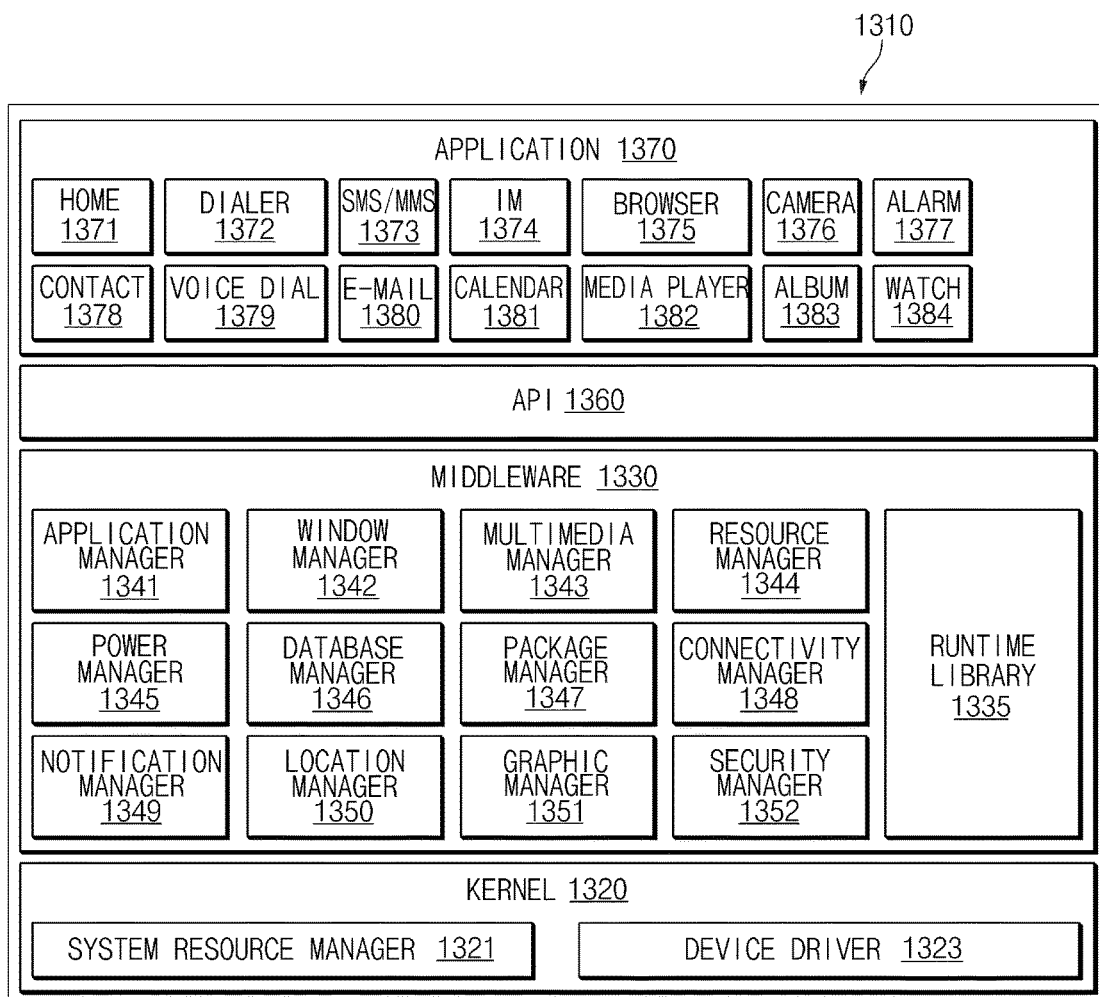
FIG. 13 illustrates a block diagram of a program module, according to an embodiment of the present disclosure.

FIG. 13 illustrates a block diagram of a program module, according to an embodiment of the present disclosure.

According to an embodiment of the present disclosure, the program module 1310 (e.g., a program 1140) may include an operating system (OS) that controls resources related to an electronic device 1101, and various application programs (e.g., an application program 1147) that are driven on an operating system. The operating system, for example, may include Android™, iOS™, Windows™, Symbian™, Tizen™, or Bada™.

The program module 1310 includes a kernel 1320, a middleware 1330, an API 1360, or applications 1370. At least a part of the program module 1310 may be preloaded on an electronic device or may be downloaded from the first electronic device 1102, the second electronic device 1104, and the server 1106.

The kernel 1320 (e.g., the kernel 1141) includes, for example, a system resource manager 1321, or a device driver 1323. The system resource manager 1321 may control, allocate, or retrieve the system resources. According to an embodiment of the present disclosure, the system resource manager 1321 may include a process management unit, a memory management unit, or a file system management unit. The device driver 1323 may include, for example, a display driver, a camera driver, a Bluetooth driver, a shared-memory driver, a USB driver, a keypad driver, a Wi-Fi driver, an audio driver, or an inter-process communication (IPC) driver.

The middleware 1330 may provide a function required by the applications 1370 in common or provide various functions to the applications 1370 through the API 1360 so that the applications 1370 can efficiently use limited system resources of the electronic device. According to an embodiment of the present disclosure, the middleware 1330 (e.g., the middleware 1143) includes, for example, at least one of a runtime library 1335, an application manager 1341, a window manager 1342, a multimedia manager 1343, a resource manager 1344, a power manager 1345, a database manager 1346, a package manager 1347, a connectivity manager 1348, a notification manager 1349, a location manager 1350, a graphic manager 1351, a security manager 1352, and a payment manager 1354.

The run time library 1335 may include, for example, a library module that a compiler uses in order to add new functions through a programming language while the applications 1370 are executed. The run time library 1335 may perform input/output management, memory management, or a function for an arithmetic function.

The application manager 1341, for example, may manage a lifecycle of at least one of the applications 1370. The window manager 1342 may manage a GUI resource used in a screen. The multimedia manager 1343 may detect a format required for reproducing various media files and encode or decode a media file using a codec appropriate for the corresponding format. The resource manager 1344 may manage resources, such as a source code, a memory, or a storage space, of at least one of the applications 1370.

The power manager 1345 may operate together with, for example, a basic input/output system (BIOS), so as to manage a battery or power and may provide power information required for the operation of the electronic device. The database manager 1346 may generate, search for, or change a database to be used by at least one of the applications 1370. The package manager 1347 may manage the installation or the updating of applications distributed in a package file form.

For example, the connectivity manager 1348 may manage wireless connections, such as Wi-Fi or Bluetooth. The notification manager 1349 may display or notify an event such as a received message, an appointment, a proximity notification, and the like to a user. The location manager 1350 may manage location information of the electronic device. The graphic manager 1351 may manage graphic effects to be provided to a user and user interfaces related to the graphic effects. The security manager 1352 may provide various security functions required for system security or user authentication. According to an embodiment of the present disclosure, when the electronic device 1101 has a phone function, the middleware 1330 may further include a telephony manager for managing a voice or video communication function of the electronic device.

The middleware 1330 may include a middleware module for forming a combination of various functions of the aforementioned components. The middleware 1330 may provide modules specialized according to the type of OS in order to provide differentiated functions. In addition, some existing components may be dynamically removed from the middleware 1330, or new components may be added to the middleware 230.

The API 1360 (e.g., the API 1145) is, for example, a set of API programming functions, and may be provided another configuration according to an operating system. For example, for each platform, one API set may be provided in a case of Android or iOS, and two or more API sets may be provided in a case of Tizen.

The application 1370 (e.g., the application program 1147) includes, for example, a home 1371, a dialer 1372, an SMS/MMS 1373, an instant message (IM) 1374, a browser 1375, a camera 1376, an alarm 1377, a contact 1378, a sound dial 1379, an e-mail 1380, a calendar 1381, a media player 1382, an album 1383, a clock 1384, or at least one application that may provide health care (e.g., measuring an exercise degree or blood glucose level) or environmental information.

According to an embodiment of the present disclosure, the application 1370 may include an information exchange application that supports exchange of information between the first electronic device 1101 and the second electronic device 1102. The information exchange application may include, for example, a notification relay application for forwarding specific information to an external electronic device, or a device management application for managing an external electronic device.

For example, the notification relay application may have a function of forwarding, to external electronic devices, notification information generated from other applications of the electronic device 10 (e.g., an SMS/MMS application, an e-mail application, a health care application, and an environmental information application). The notification relay application may receive notification information from, for example, an external electronic device and provide the received notification information to a user.

The device management application may, for example, manage (e.g., install, delete, or update) a function for at least a part of an external electronic communicating with the electronic device 1101 (e.g., activating/deactivating the external electronic device itself (or some components thereof) or adjusting the brightness (or resolution) of a display), an application operating in the external electronic device, or a service provided from the external electronic device (e.g., a telephone call service or a message service).

According to an embodiment of the present disclosure, the application 1370 may include an application (e.g., a health management application) designated according to an attribute of an external electronic device. The application 1370 may include an application that is received from the first electronic device 1102, the second electronic device 1104, or the server 1106). The applications 1370 may include a preloaded application or a third party application that is downloaded from a server. The names of the elements of the program module 1310 may vary according to the type of the operating system.

According to an embodiment of the present disclosure, at least a part of the program module 1310 may be implemented by software, firmware, hardware, or two or more combinations thereof. At least a part of the program module 1310, for example, may be implemented (e.g., executed) by a processor (e.g., the processor 1210). At least a part of the program module 1310 may include, for example, a module, a program routine, a set of instructions, or a process for performing at least one function.

The term "module" as used in the specification may mean a unit including, for example, one of hardware, software, or firmware or a combination of the two or more of them. The term "module" may be interchangeably used, for example, with a unit, logic, a logical block, a component, or a circuit. The module may be a minimum unit or a part of an integrally configured part. The module may be a minimum unit or a part which performs one or more functions. The module may be implemented mechanically or electromagnetically. For example, the module may include at least one of an application-specific integrated circuit (ASIC) chip, a field-programmable gate array, or a programmable-logic device, which has been known, will be developed in the future, or performs certain operations.

At least some of the devices (e.g., modules or functions) or methods (e.g., operations), according to an embodiment of the present disclosure, may be implemented by an instruction stored in a non-transitory computer-readable storage medium, for example, in the form of a program module. When the instruction is executed by the processor 1120, the processor 1120 may perform a function corresponding to the instruction. The non-transitory computer-readable storage medium may be, for example, a memory 1130.

The non-transitory computer-readable storage medium may include a hard disk, a floppy disk, a magnetic medium (e.g., a magnetic tape), an optical medium (e.g., a compact disk read only memory (CD-ROM)), a digital versatile disk (DVD), a magneto-optical medium (e.g., a floptical disk), a hardware device (e.g., a read only memory (ROM), a random access memory (RAM), or a flash memory). Further, the program instructions may include high-level language codes which may be executed by a computer using an interpreter as well as machine languages created by using a compiler. The above-mentioned hardware device may be configured to operate as one or more software module to perform operations, and the converse is true.

The module or program module, according to an embodiment of the present disclosure, may include at least one of the above-mentioned elements, omit some of them, or further include other elements. The module, the program module, or the operations performed by other elements may be performed in a sequential, parallel, iterative, or heuristic method. Further, some operations may be executed in another sequence or may be omitted, or other operations may be added.

Further, the embodiments disclosed herein are provided to describe the technical contents or for understanding of the technical contents, and the technical scope of the present disclosure is not limited thereto. Accordingly, the scope of the present disclosure should be construed to include all changes or an embodiment based on the technical spirit of the present disclosure.

According to an embodiment of the present disclosure, the display structure may be utilized as the antenna of the electronic device. Further, the antenna radiator structure may be prevented from being damaged or distorted, and a stable antenna structure may be maintained after the assembly process of the electronic device.

While the present disclosure has been shown and described with reference to certain embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a housing including a first surface facing in a first direction, a second surface facing in a second direction opposite from the first direction, and a side plate facing a third direction substantially perpendicular to the first direction and surrounding at least part of a space between the first surface and the second surface;
   a display disposed in the housing and exposed through the first surface;
   a first plate attached to the display or is integrated into the display, the first plate facing the first direction and comprising a first periphery that extends along the side plate;
   a second plate that faces in the third direction and is positioned adjacent to the side plate, the second plate comprising a second periphery that extends along the first periphery;
   a flexible printed circuit board (FPCB) that comprises a first planar portion coupled to the first plate, and a second planar portion coupled to the second plate and is angled from the first planar portion;
   a printed circuit board (PCB) interposed between the display and the second surface; and
   a mid-plate disposed in the housing and supporting the PCB,
   wherein the second planar portion of the FPCB is interposed between a side surface of the mid-plate and the second plate of the mid-plate, and the side surface and the second planar portion of the FPCB are separated from each other by a gap, and
   wherein the FPCB and the second plate define at least one electrical path for receiving a signal of a specific frequency band, and the first plate corresponds to a ground for the at least one electrical path.

2. The electronic device of claim 1, wherein the side surface of the mid-plate faces the third direction.

3. The electronic device of claim 1, wherein the side surface of the mid-plate and the third direction are not perpendicular to each other.

4. The electronic device of claim 1, wherein the side surface of the mid-plate is at least partially curved.

5. The electronic device of claim 1, wherein at least one of the first plate and the second plate comprises a conductive material.

6. The electronic device of claim 5, further comprising:
   a wireless communication circuit electrically connected to the second plate, wherein the wireless communication circuit uses at least one of the first plate and the second plate as an antenna element.

7. An electronic device comprising:
a cover window that defines at least a portion of a side housing of the electronic device and a front housing of the electronic device;
a display panel disposed under the cover window;
a metal panel disposed under the display panel and comprises a first area disposed parallel to the front housing and a second area disposed at an angle to the first area;
a conductor attached to a lower side of the first area and an inner side of the second area;
an insulation member disposed between the conductor and a printed circuit board (PCB) and has an opening; and
a control circuit disposed on the PCB and electrically connected to the conductor through a connection member provided through the opening,
wherein the conductor and the second area define at least one electrical path for receiving a signal of a specific frequency band, and the first area corresponds to a ground for the at least one electrical path.

8. The electronic device of claim 7, wherein the first area and the second area are physically separated from each other.

9. The electronic device of claim 7, wherein the second area corresponds to an area disposed at an angle from at least one end of the first area.

10. The electronic device of claim 7, wherein the insulation member provides a gap inside the second area.

11. The electronic device of claim 7, wherein the insulation member defines an inclination inside the second area.

12. The electronic device of claim 7, further comprising:
a rear case disposed under the PCB which defines at least a portion of the side housing of the electronic device and a rear housing of the electronic device.

13. The electronic device of claim 12, wherein the rear case covers at least a portion of the cover window on a side surface of the electronic device.

14. The electronic device of claim 7, further comprising:
an elastic member attached to the insulation member,
wherein the elastic member presses the conductor on the second area.

15. The electronic device of claim 14, wherein a rigid member is attached to one end of the conductor, and
wherein the rigid member is movable in a first direction with respect to the elastic member and not movable in a direction opposite to the first direction.

16. The electronic device of claim 7, further comprising:
an elastic member, one end of which is fixed onto the PCB and which contacts the conductor through the insulation member,
wherein the elastic member presses the conductor on the second area.

17. An electronic device comprising:
a cover window on a front housing of the electronic device;
a display panel disposed under the cover window;
a metal panel disposed under the display panel and disposed parallel to the front housing;
a metal frame that defines a side housing of the electronic device;
a conductor disposed under the metal panel and one end of which is angled to electrically contact the metal frame;
an insulation member disposed between the conductor and a printed circuit board (PCB) and has an opening; and
a control circuit disposed on the PCB and electrically connected to the conductor through a connection member provided through the opening,
wherein the conductor and the metal frame include at least one electrical path for receiving a signal of a specific frequency band, and the metal panel corresponds to a ground for the electrical path.

* * * * *